(12) United States Patent
Priyadarshi

(10) Patent No.: US 11,550,623 B2
(45) Date of Patent: Jan. 10, 2023

(54) DISTRIBUTED SYSTEM TASK MANAGEMENT USING A SIMULATED CLOCK

(71) Applicant: Beijing Voyager Technology Co., Ltd., Beijing (CN)

(72) Inventor: Alok Priyadarshi, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 429 days.

(21) Appl. No.: 16/727,665

(22) Filed: Dec. 26, 2019

(65) Prior Publication Data
US 2020/0210234 A1     Jul. 2, 2020

Related U.S. Application Data

(60) Provisional application No. 62/786,290, filed on Dec. 28, 2018.

(51) Int. Cl.
*G06F 9/48*     (2006.01)
*G06F 9/38*     (2018.01)
(Continued)

(52) U.S. Cl.
CPC .......... *G06F 9/4881* (2013.01); *G05D 1/0094* (2013.01); *G06F 1/14* (2013.01);
(Continued)

(58) Field of Classification Search
CPC .......... G06F 9/4881; G06F 30/20; G06F 1/14; G06F 9/3818; G05D 1/0094
(Continued)

(56) References Cited

U.S. PATENT DOCUMENTS 5,412,756 A *   5/1995   Bauman ................. G06N 5/043
                                                              706/45
5,822,593 A *   10/1998   Lamping ................. G06F 8/30
                                                              717/161
(Continued)

FOREIGN PATENT DOCUMENTS

CN         102789403 A     11/2012
CN         102929158 A      2/2013
(Continued)

OTHER PUBLICATIONS

Multiple threads on a single CPU. Mar. 13, 2006 [Retrieved on Mar. 13, 2020 from http://www.qnx.com/developers/docs/qnxcar2/index.jsp?topic=%2Fcom.qnx.doc.neutrino.getting_started%2Ftopic%2Fs1_procs_Multiple_threads_single_CPU.html].
(Continued)

*Primary Examiner* — Paul R. Myers
(74) *Attorney, Agent, or Firm* — Knobbe, Martens, Olson & Bear, LLP

(57) ABSTRACT

Systems and methods are provided for the deterministic simulation of distributed systems, such as vehicle-based processing systems. A distributed system may be represented as a plurality of subsystems or "nodelets" executing with a single process of a computing device during a simulation. A simulated clock may be used during execution of the nodelets to mitigate the variability in timestamped data that may be caused by latency or jitter. In some embodiments, all timestamps generated during a given frame of work will be assigned the same time value, regardless of when within the frame the timestamps were generated. A task scheduler can update the value of the simulated clock as execution proceeds through different frames of work.

19 Claims, 11 Drawing Sheets

(51) Int. Cl.
*G06F 1/14* (2006.01)
*G06F 30/20* (2020.01)
*G05D 1/00* (2006.01)

(52) U.S. Cl.
CPC ............ *G06F 9/3818* (2013.01); *G06F 30/20* (2020.01); *G05D 2201/0213* (2013.01)

(58) Field of Classification Search
USPC .......................................................... 718/102
See application file for complete search history.

(56) References Cited

U.S. PATENT DOCUMENTS

| | | | |
|---|---|---|---|
| 6,609,051 B2 | 8/2003 | Fiechter et al. | |
| 6,736,325 B1* | 5/2004 | Peacham | G07F 7/1008 235/487 |
| 7,257,814 B1* | 8/2007 | Melvin | G06F 9/3851 712/225 |
| 8,370,124 B1* | 2/2013 | Gold | B64G 7/00 700/8 |
| 9,922,148 B2 | 3/2018 | Maturana et al. | |
| 2002/0156611 A1* | 10/2002 | Lenormand | G06F 9/5066 703/22 |
| 2005/0027500 A1* | 2/2005 | Cornhill | G06F 9/455 703/13 |
| 2005/0093868 A1* | 5/2005 | Hinckley | H04W 4/21 345/506 |
| 2007/0239975 A1* | 10/2007 | Wang | G06F 9/3861 712/241 |
| 2009/0177602 A1* | 7/2009 | Ning | B60W 40/09 706/21 |
| 2010/0240459 A1* | 9/2010 | Shelton | A63F 13/12 463/42 |
| 2011/0161966 A1 | 6/2011 | Tamiya et al. | |
| 2011/0218792 A1 | 9/2011 | Whisnant et al. | |
| 2011/0296133 A1* | 12/2011 | Flynn | G06F 3/0652 711/171 |
| 2012/0084062 A1 | 4/2012 | Maturana et al. | |
| 2012/0158817 A1 | 6/2012 | Lauderdale et al. | |
| 2012/0221311 A1 | 8/2012 | Shachar et al. | |
| 2012/0317555 A1* | 12/2012 | Aluru | G06F 11/3664 717/134 |
| 2015/0032358 A1* | 1/2015 | Amemiya | B60L 50/16 701/104 |
| 2016/0092247 A1 | 3/2016 | Branson et al. | |
| 2016/0210775 A1* | 7/2016 | Alaniz | G06F 30/15 |
| 2018/0203445 A1 | 7/2018 | Micks et al. | |
| 2019/0050512 A1 | 2/2019 | Grau | |
| 2020/0209861 A1 | 7/2020 | Priyadarshi | |
| 2020/0210234 A1 | 7/2020 | Priyadarshi | |
| 2020/0299001 A1* | 9/2020 | Restifo | G07C 5/008 |
| 2020/0319974 A1* | 10/2020 | Lacey | G06F 1/30 |
| 2020/0384998 A1* | 12/2020 | Yang | G06F 30/15 |
| 2021/0174960 A1* | 6/2021 | Gee | G16H 40/40 |
| 2021/0248278 A1* | 8/2021 | Solomon | G06F 30/12 |

FOREIGN PATENT DOCUMENTS

| | | |
|---|---|---|
| CN | 109035121 | 12/2018 |
| GB | 2370661 A | 7/2002 |
| JP | 11-212818 | 8/1999 |
| JP | 2000-067030 | 3/2000 |

OTHER PUBLICATIONS

International Search Report dated Mar. 30, 2020 for International Patent Application No. PCT/US2019/068606, filed Dec. 26, 2019. 14 pages.
International Search Report dated Mar. 30, 2020 for International Patent Application No. PCT/US2019/068596, filed Dec. 26, 2019. 10 pages.
PCT Search Report of International Application No. PCT/US2019/068599, filed Dec. 26, 2019. 13 pages.

* cited by examiner

DISTRIBUTED SYSTEM TASK MANAGEMENT USING A SIMULATED CLOCK

INCORPORATION BY REFERENCE TO ANY PRIORITY APPLICATIONS

Any and all applications, if any, for which a foreign or domestic priority claim is identified in the Application Data Sheet of the present application are hereby incorporated by reference in their entireties under 37 CFR 1.57.

COPYRIGHT NOTICE

A portion of the disclosure of this patent document contains material which is subject to copyright protection. The copyright owner has no objection to the facsimile reproduction by anyone of the patent document and/or the patent disclosure as it appears in the United States Patent and Trademark Office patent file and/or records, but otherwise reserves all copyrights whatsoever.

BACKGROUND

Vehicles—such as vehicles used for ride-sharing purposes, vehicles that provide driver-assist functionality, and/or automated or autonomous vehicles (AVs)—may obtain and process sensor data using an on-board data processing system to perform a variety of functions. For example, functions can include determining and/or displaying navigational routes, identifying road signs, detecting objects and/or road obstructions, controlling vehicle operation, and/or the like.

During operation of a vehicle, the onboard processing system can process sensor data received from sensors of the vehicle. In addition, the onboard processing system can be tested without necessarily requiring operation of a vehicle or use of sensors during testing. For example, the onboard processing system can be tested by using previously-received and stored sensor data and/or sensor data that is generated specifically for use in testing particular scenarios.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

One aspect includes systems, methods, and/or non-transitory computer-readable media that provide features for simulation of distributed systems. The features include loading a plurality of subsystems into a portion of computer-readable memory allocated to a single process, wherein the plurality of subsystems are configured to operate in a first operating mode in which the plurality of subsystems executes only serially to process simulated sensor data, and in a second operating mode in which two or more subsystems of the plurality of subsystems execute concurrently to process sensor data. The plurality of subsystems is scheduled for execution in the first operating mode. A channel is established for communication to a first subsystem of the plurality of subsystems. In-process data is sent to the first subsystem using the channel, wherein the in-process data is generated by a second subsystem of the plurality of subsystems based at least partly on the simulated sensor data, and wherein the channel copies the in-process data from a first location of the portion of the computer-readable memory allocated to the process to a second location of the portion of the computer-readable memory allocated to the process.

Another aspect includes systems, methods, and/or non-transitory computer-readable media that provide features for distributed system execution using a serial timeline. The features include receiving input data that simulates output of a vehicle-based sensor. A first nodelet, of a vehicle-based processing system comprising a plurality of executable nodelets, is to perform a first operation using the input data. A second nodelet of the vehicle-based processing system is to perform a second operation using the input data, wherein the second nodelet is configured to operate independently of the first nodelet. The first nodelet is scheduled to perform the first operation during a first period of time, wherein no other nodelet of the plurality of executable nodelets is permitted to execute during the first period of time. The second nodelet is scheduled to perform the second operation during a second period of time following the first period of time, wherein no other nodelet of the plurality of executable nodelets is permitted to execute during the second period of time. The first nodelet is executed to perform the first operation during the first period of time, wherein the first operation generates output data to be processed by a third nodelet of the plurality of executable nodelet. The third nodelet is scheduled to perform a third operation during a third period of time following the second period of time. The second nodelet is executed to perform the second operation during the second period of time. In addition, the third nodelet is executed to perform the third operation during the third period of time.

A further aspect includes systems, methods, and/or non-transitory computer-readable media that provide features for distributed system task management using a simulated clock. The features include loading an input data item from an input data collection comprising simulated sensor data. A time is determined, represented by a first timestamp associated with the input data item. A simulated clock is set to the time represented by the first timestamp. A subsystem of a plurality of subsystems is determined for processing the input data item. The subsystem is executed, wherein a period of time passes during execution of the subsystem, wherein the simulated clock remains static during execution of the subsystem, and wherein the subsystem uses the simulated clock to generate a second timestamp associated with an output message.

DETAILED DESCRIPTION

Figure 1A:
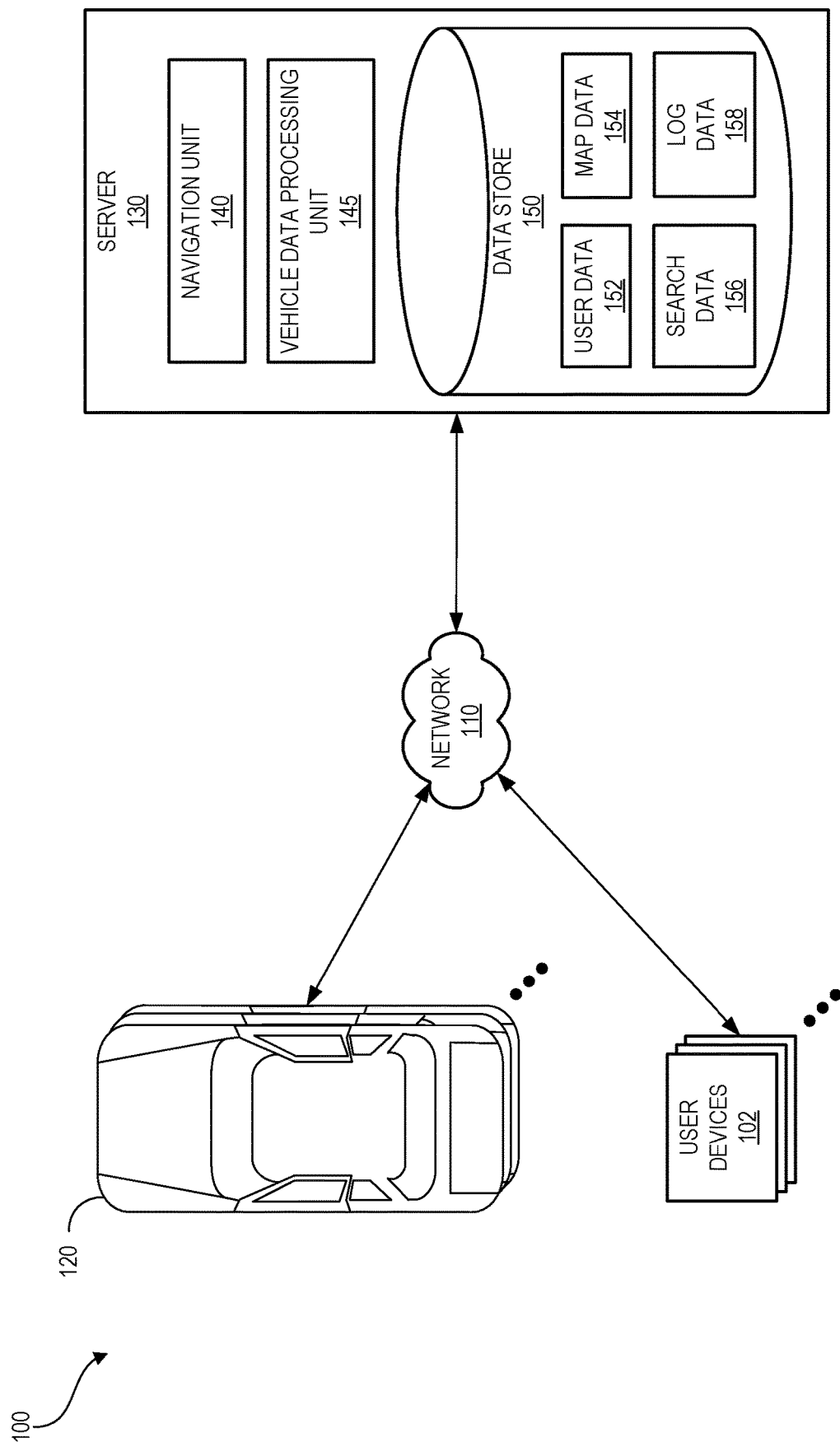
FIG. 1A illustrates a block diagram of a networked vehicle environment in which one or more vehicles and/or one or more user devices interact with a server via a network, according to certain aspects of the present disclosure.

The present disclosure is directed to simulating the operations of a distributed processing system in a synchronous and deterministic manner. The distributed processing system may have multiple executable components, also referred to as "nodes," that communicate using a publish-subscribe messaging protocol. Data that is input into the system may be processed by some nodes, which publish data to which other nodes subscribe for performing additional processing, and so on.

Some conventional distributed processing systems execute in an asynchronous manner, allowing nodes to execute on different threads or in different processes altogether. The terms "thread" and "process" are used herein according to their ordinary and customary meaning in the field of computer technology. For example, the term process can be used to refer to an instance of a computer program that is being executed by a computing device, including the portion of computer memory that stores executable code and instance-specific data (e.g., a call stack, a heap or other data structure for variable values, etc.). The term "thread" can be used to refer to a sequence of operations that are performed within a process. Multiple threads can exist within one process, executing concurrently and sharing resources such as memory (e.g., executable code, values of dynamically allocated variables, etc.). Direct communication between processes, however, may be prohibited by the computing device's operating system. In these cases, different processes may be required to communicate using defined inter-process communication mechanisms, such as those under control of the operating system.

Execution of nodes on different threads or in different processes can result in a sequence of operations that may vary depending upon a variety of factors (e.g., when the individual nodes were first launched, the variable latencies that affect inter-process communication, etc.). While systems may be designed to account for such variability, the variability can cause inconsistencies when using simulations to test the systems. For example, a given input or set of inputs may be processed by nodes operating in a different sequence from simulation to simulation, even when the input or set of inputs remains constant across simulations. The non-deterministic character of such simulations can interfere with identifying problems, testing solutions, and the like. A distributed asynchronous system that can be tested using simulations that are deterministic (e.g., a single input or set of inputs always causes the system to perform the same operations in the same sequence and produce the same output) can thus be beneficial in identifying problems, testing solutions, and the like.

Some aspects of the present disclosure relate to replacing complex multi-threaded nodes—designed to execute in separate processes—with sets of smaller subsystems, also referred to as "nodelets." In comparison with a complex node, a sub-graph of nodelets can provide the same functionality while also providing the flexibility to run in either a multi-threaded or single-threaded mode of operation. Thus, the sub-graph can provide the performance required by a production system (e.g., in multi-threaded mode), while also providing the deterministic processing required when running simulations (e.g., in single-threaded mode). Moreover, all nodelets may also execute within the same process, and communications between nodelets therefore occur within a single process space of system memory. These in-process communications do not experience the same degree of latency as inter-process communications required in a system in which nodes execute in different process spaces of system memory.

Additional aspects of the present disclosure relate to scheduling the operation of nodelets such that individual nodelets operate only within defined, serially-occurring timeframes (also referred to simply as "frames" for convenience). A task scheduler can interleave frames for multiple nodelets within a single thread such that the nodelets operate in a serial manner according to a single timeline. In some embodiments, only one nodelet may execute in any given frame, and therefore only one nodelet of the system may be active at any given time. For example, a nodelet may perform an operation in a first frame, and then stop or "sleep" while one or more nodelets perform operations in one or more subsequent frames. Eventually, if the first nodelet is to perform an additional operation (e.g., another input is to be processed by the first nodelet, the first nodelet has requested a callback, etc.), the task scheduler can schedule another frame within the serial timeline of frames. The first nodelet can perform its additional operation during this additional frame. By scheduling operations of all nodelets to occur in separate serially-occurring frames, certain issues that occur in asynchronous distributed systems (e.g., race conditions) can be avoided. Thus, the interleaving of frames in a single serial timeline facilities deterministic execution during simulations.

Further aspects of the present disclosure relate to using a simulated clock, rather than a continuously-advancing system clock, to facilitate to the deterministic operation of the system during simulations. The simulated clock may be set by the task scheduler at the beginning of each frame. In addition, the time indicated by the simulated clock may not change until the task scheduler increments or otherwise sets the simulated clock to another time for a subsequent frame. Thus, the time given by the simulated clock does not progress continuously during the course of execution, but rather jumps from value to value as new frames begin. Timestamped data that is generated at any point during a given frame will therefore be timestamped with the same value, according to the simulated clock, regardless of when within the frame the timestamped data is generated. Accordingly, jitter and the latencies that change from simulation to simulation—and which would normally impact the amount of time elapsed between events and otherwise affect time-stamped data—do not impact simulations that use the simulated clock.

Detailed descriptions and examples of systems and methods according to one or more illustrative embodiments of the present disclosure may be found, at least, in the section entitled Deterministic Simulation Architecture and Execution, as well as in the section entitled Example Embodiments, and also in FIGS. 2-10 herein. Furthermore, components and functionality for deterministic simulation of distributed systems may be configured and/or incorporated into the networked vehicle environment 100 described herein in FIGS. 1A-1B.

Various embodiments described herein are intimately tied to, enabled by, and would not exist except for, vehicle and/or computer technology. For example, the systems and methods for deterministic simulation of distributed processing systems described herein in reference to various embodiments cannot reasonably be performed by humans alone, without the vehicle and/or computer technology upon which they are implemented.

Networked Vehicle Environment

FIG. 1A illustrates a block diagram of a networked vehicle environment 100 in which one or more vehicles 120 and/or one or more user devices 102 interact with a server 130 via a network 110, according to certain aspects of the present disclosure. For example, the vehicles 120 may be equipped to provide ride-sharing and/or other location-based services, to assist drivers in controlling vehicle operation (e.g., via various driver-assist features, such as adaptive and/or regular cruise control, adaptive headlight control, anti-lock braking, automatic parking, night vision, blind spot monitor, collision avoidance, crosswind stabilization, driver drowsiness detection, driver monitoring system, emergency driver assistant, intersection assistant, hill descent control, intelligent speed adaptation, lane centering, lane departure warning, forward, rear, and/or side parking sensors, pedestrian detection, rain sensor, surround view system, tire pressure monitor, traffic sign recognition, turning assistant, wrong-way driving warning, traffic condition alerts, etc.), and/or to fully control vehicle operation. Thus, the vehicles 120 can be regular gasoline, natural gas, biofuel, electric, hydrogen, etc. vehicles configured to offer ride-sharing and/or other location-based services, vehicles that provide driver-assist functionality (e.g., one or more of the driver-assist features described herein), and/or automated or autonomous vehicles (AVs). The vehicles 120 can be automobiles, trucks, vans, buses, motorcycles, scooters, bicycles, and/or any other motorized vehicle.

The server 130 can communicate with the vehicles 120 to obtain vehicle data, such as route data, sensor data, perception data, vehicle 120 control data, vehicle 120 component fault and/or failure data, etc. The server 130 can process and store the vehicle data for use in other operations performed by the server 130 and/or another computing system (not shown). Such operations can include running diagnostic models to identify vehicle 120 operational issues (e.g., the cause of vehicle 120 navigational errors, unusual sensor readings, an object not being identified, vehicle 120 component failure, etc.); running models to simulate vehicle 120 performance given a set of variables; identifying objects that cannot be identified by a vehicle 120, generating control instructions that, when executed by a vehicle 120, cause the vehicle 120 to drive and/or maneuver in a certain manner along a specified path; and/or the like.

The server 130 can also transmit data to the vehicles 120. For example, the server 130 can transmit map data, firmware and/or software updates, vehicle 120 control instructions, an identification of an object that could not otherwise be identified by a vehicle 120, passenger pickup information, traffic data, and/or the like.

In addition to communicating with one or more vehicles 120, the server 130 can communicate with one or more user devices 102. In particular, the server 130 can provide a network service to enable a user to request, via an application running on a user device 102, location-based services (e.g., transportation services, such as ride-sharing services). For example, the user devices 102 can correspond to a computing device, such as a smart phone, tablet, laptop, smart watch, or any other device that can communicate over the network 110 with the server 130. In the embodiment, a user device 102 executes an application, such as a mobile application, that the user operating the user device 102 can use to interact with the server 130. For example, the user device 102 can communicate with the server 130 to provide location data and/or queries to the server 130, to receive map-related data and/or directions from the server 130, and/or the like.

The server 130 can process requests and/or other data received from user devices 102 to identify service providers (e.g., vehicle 120 drivers) to provide the requested services for the users. In addition, the server 130 can receive data—such as user trip pickup or destination data, user location query data, etc.—based on which the server 130 identifies a region, an address, and/or other location associated with the various users. The server 130 can then use the identified location to provide services providers and/or users with directions to a determined pickup location.

The application running on the user device 102 may be created and/or made available by the same entity responsible for the server 130. Alternatively, the application running on the user device 102 can be a third-party application that includes features (e.g., an application programming interface or software development kit) that enables communications with the server 130.

A single server 130 is illustrated in FIG. 1A for simplicity and ease of explanation. It is appreciated, however, that the server 130 may be a single computing device, or may include multiple distinct computing devices logically or physically grouped together to collectively operate as a server system. The components of the server 130 can be implemented in application-specific hardware (e.g., a server computing device with one or more ASICs) such that no software is necessary, or as a combination of hardware and software. In addition, the modules and components of the server 130 can be combined on one server computing device or separated individually or into groups on several server computing devices. In some embodiments, the server 130 may include additional or fewer components than illustrated in FIG. 1A.

The network 110 includes any wired network, wireless network, or combination thereof. For example, the network 110 may be a personal area network, local area network, wide area network, over-the-air broadcast network (e.g., for radio or television), cable network, satellite network, cellular telephone network, or combination thereof. As a further example, the network 110 may be a publicly accessible network of linked networks, possibly operated by various distinct parties, such as the Internet. In some embodiments, the network 110 may be a private or semi-private network, such as a corporate or university intranet. The network 110 may include one or more wireless networks, such as a Global System for Mobile Communications (GSM) network, a Code Division Multiple Access (CDMA) network, a Long Term Evolution (LTE) network, or any other type of wireless network. The network 110 can use protocols and components for communicating via the Internet or any of the other aforementioned types of networks. For example, the protocols used by the network 110 may include Hypertext Transfer Protocol (HTTP), HTTP Secure (HTTPS), Message Queue Telemetry Transport (MQTT), Constrained Application Protocol (CoAP), and the like. Protocols and components for communicating via the Internet or any of the other aforementioned types of communication networks are well known to those skilled in the art and, thus, are not described in more detail herein.

The server 130 can include a navigation unit 140, a vehicle data processing unit 145, and a data store 150. The navigation unit 140 can assist with location-based services. For example, the navigation unit 140 can facilitate the transportation of a user (also referred to herein as a "rider") and/or an object (e.g., food, packages, etc.) by another user (also referred to herein as a "driver") from a first location (also referred to herein as a "pickup location") to a second location (also referred to herein as a "destination location"). The navigation unit 140 may facilitate user and/or object transportation by providing map and/or navigation instructions to an application running on a user device 102 of a rider, to an application running on a user device 102 of a driver, and/or to a navigational system running on a vehicle 120.

As an example, the navigation unit 140 can include a matching service (not shown) that pairs a rider requesting a trip from a pickup location to a destination location with a driver that can complete the trip. The matching service may interact with an application running on the user device 102 of the rider and/or an application running on the user device 102 of the driver to establish the trip for the rider and/or to process payment from the rider to the driver.

The navigation unit 140 can also communicate with the application running on the user device 102 of the driver during the trip to obtain trip location information from the user device 102 (e.g., via a global position system (GPS) component coupled to and/or embedded within the user device 102) and provide navigation directions to the application that aid the driver in traveling from the current location of the driver to the destination location. The navigation unit 140 can also direct the driver to various geographic locations or points of interest, regardless of whether the driver is carrying a rider.

The vehicle data processing unit 145 can be configured to support vehicle 120 driver-assist features and/or to support autonomous driving. For example, the vehicle data processing unit 145 can generate and/or transmit to a vehicle 120 map data, run diagnostic models to identify vehicle 120 operational issues, run models to simulate vehicle 120 performance given a set of variables, use vehicle data provided by a vehicle 120 to identify an object and transmit an identification of the object to the vehicle 120, generate and/or transmit to a vehicle 120 vehicle 120 control instructions, and/or the like.

The data store 150 can store various types of data used by the navigation unit 140, the vehicle data processing unit 145, the user devices 102, and/or the vehicles 120. For example, the data store 150 can store user data 152, map data 154, search data 156, and log data 158.

The user data 152 may include information on some or all of the users registered with a location-based service, such as drivers and riders. The information may include, for example, usernames, passwords, names, addresses, billing information, data associated with prior trips taken or serviced by a user, user rating information, user loyalty program information, and/or the like.

The map data 154 may include high definition (HD) maps generated from sensors (e.g., light detection and ranging (LiDAR) sensors, radio detection and ranging (RADAR) sensors, infrared cameras, visible light cameras, stereo cameras, an inertial measurement unit (IMU), etc.), satellite imagery, optical character recognition (OCR) performed on captured street images (e.g., to identify names of streets, to identify street sign text, to identify names of points of interest, etc.), etc.; information used to calculate routes; information used to render 2D and/or 3D graphical maps; and/or the like. For example, the map data 154 can include elements like the layout of streets and intersections, bridges (e.g., including information on the height and/or width of bridges over streets), off-ramps, buildings, parking structure entrances and exits (e.g., including information on the height and/or width of the vehicle entrances and/or exits), the placement of street signs and stop lights, emergency turn-offs, points of interest (e.g., parks, restaurants, fuel stations, attractions, landmarks, etc., and associated names), road markings (e.g., centerline markings dividing lanes of opposing traffic, lane markings, stop lines, left turn guide lines, right turn guide lines, crosswalks, bus lane markings, bike lane markings, island marking, pavement text, highway exist and entrance markings, etc.), curbs, rail lines, waterways, turning radiuses and/or angles of left and right turns, the distance and dimensions of road features, the placement of barriers between two-way traffic, and/or the like, along with the elements' associated geographical locations (e.g., geographical coordinates). The map data 154 can also include reference data, such as real-time and/or historical traffic information, current and/or predicted weather conditions, road work information, information regarding laws and regulations (e.g., speed limits, whether right turns on red lights are permitted or prohibited, whether U-turns are permitted or prohibited, permitted direction of travel, and/or the like), news events, and/or the like.

While the map data 154 is illustrated as being stored in the data store 150 of the server 130, this is not meant to be limiting. For example, the server 130 can transmit the map data 154 to a vehicle 120 for storage therein (e.g., in the data store 129, described below).

The search data 156 can include searches entered by various users in the past. For example, the search data 156 can include textual searches for pickup and/or destination locations. The searches can be for specific addresses, geographical locations, names associated with a geographical location (e.g., name of a park, restaurant, fuel station, attraction, landmark, etc.), etc.

The log data 158 can include vehicle data provided by one or more vehicles 120. For example, the vehicle data can include route data, sensor data, perception data, vehicle 120 control data, vehicle 120 component fault and/or failure data, etc.

Figure 1B:
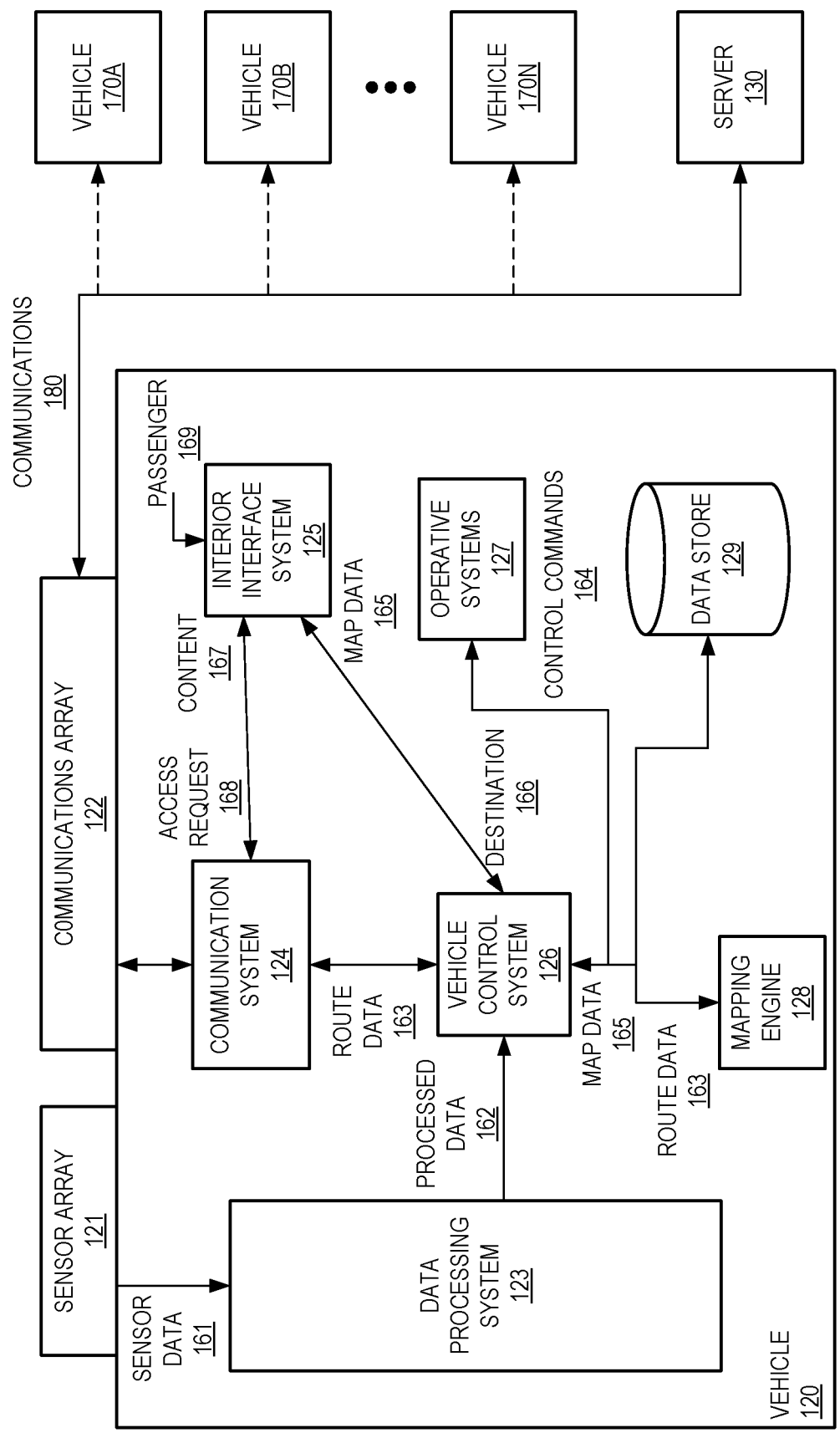
FIG. 1B illustrates a block diagram showing the vehicle of FIG. 1A in communication with one or more other vehicles and/or the server of FIG. 1A, according to certain aspects of the present disclosure.

FIG. 1B illustrates a block diagram showing the vehicle 120 of FIG. 1A in communication with one or more other vehicles 170A-N and/or the server 130 of FIG. 1A, according to certain aspects of the present disclosure. As illustrated in FIG. 1B, the vehicle 120 can include various components and/or data stores. For example, the vehicle 120 can include a sensor array 121, a communications array 122, a data processing system 123, a communication system 124, an interior interface system 125, a vehicle control system 126, operative systems 127, a mapping engine 128, and/or a data store 129.

Communications 180 may be transmitted and/or received between the vehicle 120, one or more vehicles 170A-N, and/or the server 130. The server 130 can transmit and/or receive data from the vehicle 120 as described above with respect to FIG. 1A. For example, the server 130 can transmit vehicle control instructions or commands (e.g., as communications 180) to the vehicle 120. The vehicle control instructions can be received by the communications array 122 (e.g., an array of one or more antennas configured to transmit and/or receive wireless signals), which is operated by the communication system 124 (e.g., a transceiver). The communication system 124 can transmit the vehicle control instructions to the vehicle control system 126, which can operate the acceleration, steering, braking, lights, signals, and other operative systems 127 of the vehicle 120 in order to drive and/or maneuver the vehicle 120 and/or assist a driver in driving and/or maneuvering the vehicle 120 through road traffic to destination locations specified by the vehicle control instructions.

As an example, the vehicle control instructions can include route data 163, which can be processed by the vehicle control system 126 to maneuver the vehicle 120 and/or assist a driver in maneuvering the vehicle 120 along a given route (e.g., an optimized route calculated by the server 130 and/or the mapping engine 128) to the specified destination location. In processing the route data 163, the vehicle control system 126 can generate control commands 164 for execution by the operative systems 127 (e.g., acceleration, steering, braking, maneuvering, reversing, etc.) to cause the vehicle 120 to travel along the route to the destination location and/or to assist a driver in maneuvering the vehicle 120 along the route to the destination location.

A destination location 166 may be specified by the server 130 based on user requests (e.g., pickup requests, delivery requests, etc.) transmitted from applications running on user devices 102. Alternatively or in addition, a passenger and/or driver of the vehicle 120 can provide user input(s) 169 through an interior interface system 125 (e.g., a vehicle navigation system) to provide a destination location 166. In some embodiments, the vehicle control system 126 can transmit the inputted destination location 166 and/or a current location of the vehicle 120 (e.g., as a GPS data packet) as a communication 180 to the server 130 via the communication system 124 and the communications array 122. The server 130 (e.g., the navigation unit 140) can use the current location of the vehicle 120 and/or the inputted destination location 166 to perform an optimization operation to determine an optimal route for the vehicle 120 to travel to the destination location 166. Route data 163 that includes the optimal route can be transmitted from the server 130 to the vehicle control system 126 via the communications array 122 and the communication system 124. As a result of receiving the route data 163, the vehicle control system 126 can cause the operative systems 127 to maneuver the vehicle 120 through traffic to the destination location 166 along the optimal route, assist a driver in maneuvering the vehicle 120 through traffic to the destination location 166 along the optimal route, and/or cause the interior interface system 125 to display and/or present instructions for maneuvering the vehicle 120 through traffic to the destination location 166 along the optimal route.

Alternatively or in addition, the route data 163 includes the optimal route and the vehicle control system 126 automatically inputs the route data 163 into the mapping engine 128. The mapping engine 128 can generate map data 165 using the optimal route (e.g., generate a map showing the optimal route and/or instructions for taking the optimal route) and provide the map data 165 to the interior interface system 125 (e.g., via the vehicle control system 126) for display. The map data 165 may include information derived from the map data 154 stored in the data store 150 on the server 130. The displayed map data 165 can indicate an estimated time of arrival and/or show the progress of the vehicle 120 along the optimal route. The displayed map data 165 can also include indicators, such as reroute commands, emergency notifications, road work information, real-time traffic data, current weather conditions, information regarding laws and regulations (e.g., speed limits, whether right turns on red lights are permitted or prohibited, where U-turns are permitted or prohibited, permitted direction of travel, etc.), news events, and/or the like.

The user input 169 can also be a request to access a network (e.g., the network 110). In response to such a request, the interior interface system 125 can generate an access request 168, which can be processed by the communication system 124 to configure the communications array 122 to transmit and/or receive data corresponding to a user's interaction with the interior interface system 125 and/or with a user device 102 in communication with the interior interface system 125 (e.g., a user device 102 connected to the interior interface system 125 via a wireless connection). For example, the vehicle 120 can include on-board Wi-Fi, which the passenger(s) and/or driver can access to send and/or receive emails and/or text messages, stream audio and/or video content, browse content pages (e.g., network pages, web pages, etc.), and/or access applications that use network access. Based on user interactions, the interior interface system 125 can receive content 167 via the network 110, the communications array 122, and/or the communication system 124. The communication system 124 can dynamically manage network access to avoid or minimize disruption of the transmission of the content 167.

The sensor array 121 can include any number of one or more types of sensors, such as a satellite-radio navigation system (e.g., GPS), a LiDAR sensor, a landscape sensor (e.g., a radar sensor), an IMU, a camera (e.g., an infrared camera, a visible light camera, stereo cameras, etc.), a Wi-Fi detection system, a cellular communication system, an inter-vehicle communication system, a road sensor communication system, feature sensors, proximity sensors (e.g., infrared, electromagnetic, photoelectric, etc.), distance sensors, depth sensors, and/or the like. The satellite-radio navigation system may compute the current position (e.g., within a range of 1-10 meters) of the vehicle 120 based on an analysis of signals received from a constellation of satellites.

The LiDAR sensor, the radar sensor, and/or any other similar types of sensors can be used to detect the vehicle 120 surroundings while the vehicle 120 is in motion or about to begin motion. For example, the LiDAR sensor may be used to bounce multiple laser beams off approaching objects to assess their distance and to provide accurate 3D information on the surrounding environment. The data obtained from the LiDAR sensor may be used in performing object identification, motion vector determination, collision prediction, and/or in implementing accident avoidance processes. Optionally, the LiDAR sensor may provide a 360° view using a rotating, scanning mirror assembly. The LiDAR sensor may optionally be mounted on a roof of the vehicle 120.

The IMU may include X, Y, Z oriented gyroscopes and/or accelerometers. The IMU provides data on the rotational and linear motion of the vehicle 120, which may be used to calculate the motion and position of the vehicle 120.

Cameras may be used to capture visual images of the environment surrounding the vehicle 120. Depending on the configuration and number of cameras, the cameras may provide a 360° view around the vehicle 120. The images from the cameras may be used to read road markings (e.g., lane markings), read street signs, detect objects, and/or the like.

The Wi-Fi detection system and/or the cellular communication system may be used to perform triangulation with respect to Wi-Fi hot spots or cell towers respectively, to determine the position of the vehicle 120 (optionally in conjunction with then satellite-radio navigation system).

The inter-vehicle communication system (which may include the Wi-Fi detection system, the cellular communication system, and/or the communications array 122) may be used to receive and/or transmit data to the other vehicles 170A-N, such as current speed and/or location coordinates of the vehicle 120, time and/or location coordinates corresponding to when deceleration is planned and the planned rate of deceleration, time and/or location coordinates when a stop operation is planned, time and/or location coordinates when a lane change is planned and direction of lane change, time and/or location coordinates when a turn operation is planned, time and/or location coordinates when a parking operation is planned, and/or the like.

The road sensor communication system (which may include the Wi-Fi detection system and/or the cellular communication system) may be used to read information from road sensors (e.g., indicating the traffic speed and/or traffic congestion) and/or traffic control devices (e.g., traffic signals).

When a user requests transportation (e.g., via the application running on the user device 102), the user may specify a specific destination location. The origination location may be the current location of the vehicle 120, which may be determined using the satellite-radio navigation system installed in the vehicle (e.g., GPS, Galileo, BeiDou/COMPASS, DORIS, GLONASS, and/or other satellite-radio navigation system), a Wi-Fi positioning System, cell tower triangulation, and/or the like. Optionally, the origination location may be specified by the user via a user interface provided by the vehicle 120 (e.g., the interior interface system 125) or via the user device 102 running the application. Optionally, the origination location may be automatically determined from location information obtained from the user device 102. In addition to the origination location and destination location, one or more waypoints may be specified, enabling multiple destination locations.

Raw sensor data 161 from the sensor array 121 can be processed by the onboard data processing system 123. The processed data 162 can then be sent by the data processing system 123 to the vehicle control system 126, and optionally sent to the server 130 via the communication system 124 and the communications array 122.

The data store 129 can store map data (e.g., the map data 154) and/or a subset of the map data 154 (e.g., a portion of the map data 154 corresponding to a general region in which the vehicle 120 is currently located). In some embodiments, the vehicle 120 can use the sensor array 121 to record updated map data along traveled routes, and transmit the updated map data to the server 130 via the communication system 124 and the communications array 122. The server 130 can then transmit the updated map data to one or more of the vehicles 170A-N and/or further process the updated map data.

The data processing system 123 can provide continuous or near continuous processed data 162 to the vehicle control system 126 to respond to point-to-point activity in the surroundings of the vehicle 120. The processed data 162 can comprise comparisons between the raw sensor data 161—which represents an operational environment of the vehicle 120, and which is continuously collected by the sensor array 121—and the map data stored in the data store 129. In an example, the data processing system 123 is programmed with machine learning or other artificial intelligence capabilities to enable the vehicle 120 to identify and respond to conditions, events, and/or potential hazards. In variations, the data processing system 123 can continuously or nearly continuously compare raw sensor data 161 to stored map data in order to perform a localization to continuously or nearly continuously determine a location and/or orientation of the vehicle 120. Localization of the vehicle 120 may allow the vehicle 120 to become aware of an instant location and/or orientation of the vehicle 120 in comparison to the stored map data in order to maneuver the vehicle 120 on surface streets through traffic and/or assist a driver in maneuvering the vehicle 120 on surface streets through traffic and identify and respond to potential hazards (e.g., pedestrians) or local conditions, such as weather or traffic conditions.

Furthermore, localization can enable the vehicle 120 to tune or beam steer the communications array 122 to maximize a communication link quality and/or to minimize interference with other communications from other vehicles 170A-N. For example, the communication system 124 can beam steer a radiation patterns of the communications array 122 in response to network configuration commands received from the server 130. The data store 129 may store current network resource map data that identifies network base stations and/or other network sources that provide network connectivity. The network resource map data may indicate locations of base stations and/or available network types (e.g., 3G, 4G, LTE, Wi-Fi, etc.) within a region in which the vehicle 120 is located.

While FIG. 1B describes certain operations as being performed by the vehicle 120 or the server 130, this is not meant to be limiting. The operations performed by the vehicle 120 and the server 130 as described herein can be performed by either entity. For example, certain operations normally performed by the server 130 (e.g., transmitting updating map data to the vehicles 170A-N) may be performed by the vehicle 120 for load balancing purposes (e.g., to reduce the processing load of the server 130, to take advantage of spare processing capacity on the vehicle 120, etc.).

Furthermore, any of the vehicles 170A-N may include some or all of the components of the vehicle 120 described herein. For example, a vehicle 170A-N can include a communications array 122 to communicate with the vehicle 120 and/or the server 130.

Deterministic Simulation Architecture and Execution

Figure 2:
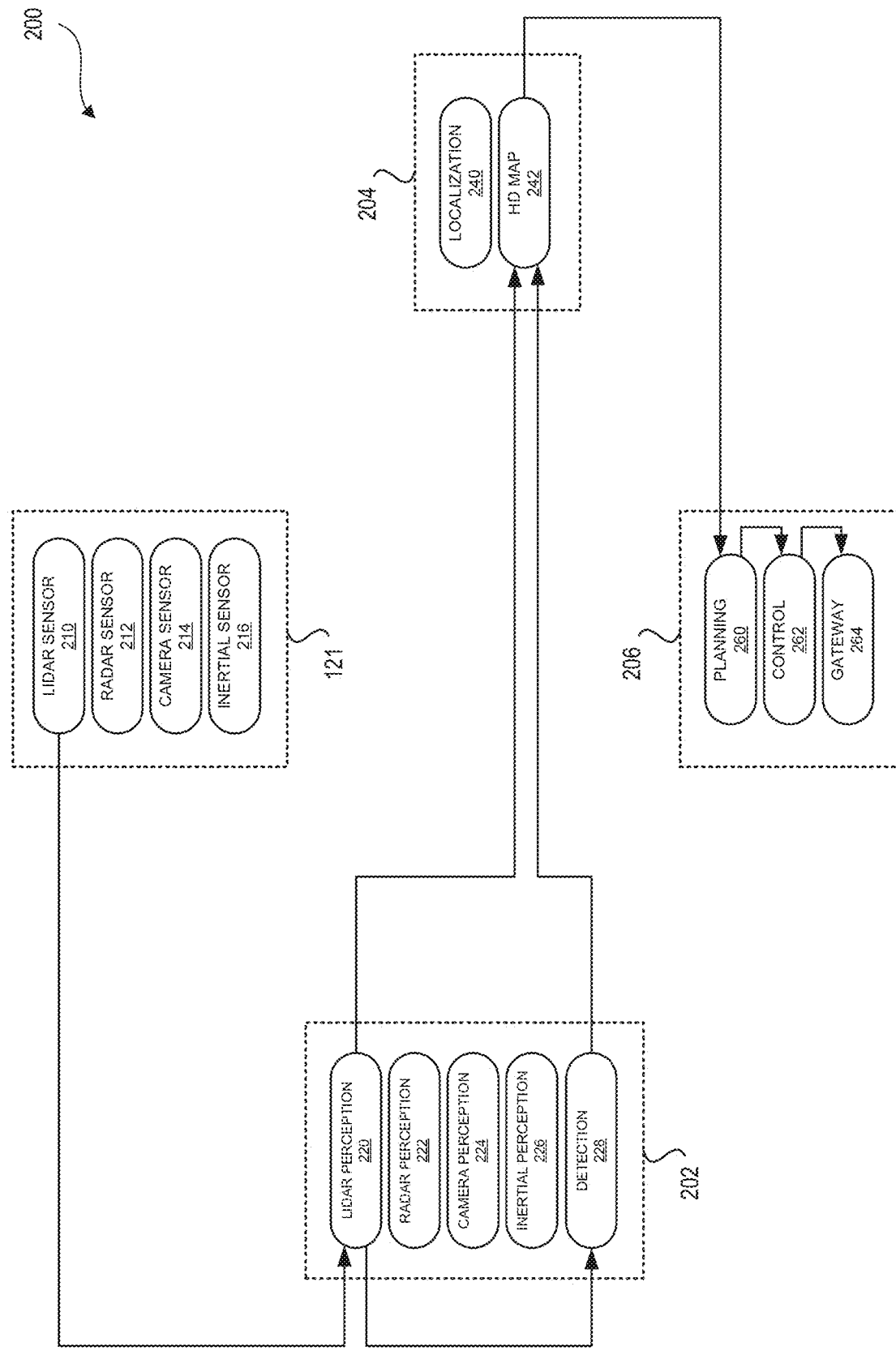
FIG. 2 illustrates a block diagram of a computation graph for processing sensor data according to one embodiment.

FIG. 2 illustrates a block diagram of a distributed processing system implemented using a distributed execution and communication architecture 200. The distributed execution and communication architecture 200 may also be referred to as a "computation graph," or simply as a "graph" for convenience. In some embodiments, various components or subsystems of a vehicle 120 may be implemented using such a computation graph 200. For example, the data processing system 123, vehicle control system 126, other components, combinations thereof, and the like may be implemented using a computation graph 200. In one specific, non-limiting embodiment, the computation graph 200 may be implemented as a Robotic Operating System ("ROS") graph.

Although the computation graph 200 is described herein with respect to specific example implementations of vehicle-based systems, the examples are illustrative only and are not intended to be limiting. In some embodiments, a computation graph 200 may be used to implement other vehicle-based systems, non-vehicle-based systems, combinations thereof, etc.

The computation graph 200 may receive input from the sensor array 121, which may include various sensors such as a LiDAR sensor 210, a RADAR sensor 212, a camera sensor 214, and an inertial sensor 216. The computation graph 200 may process the input from these sensors and generate output. For example, the output may represent detected obstacles, direction changes to be executed, speed adjustments to be executed, and the like.

The computation graph 200 includes several separate executable components, also referred to as nodes, that preform data processing operations, communications, and/or other functions. Generally described, nodes are programs that perform operations for a subset of the system (e.g., a portion of the vehicle 120). Each node may run as a separate process on the computing device(s) executing the computation graph 200. In addition, the nodes may run concurrently or asynchronously.

In some embodiments, as shown, nodes may be logically grouped by function, such as perception 202, mapping 204, and planning/control 206. Within these logical groups, there may be any number of separate nodes dedicated to particular functions. For example, the perception 202 nodes may include a LiDAR perception node 220, a RADAR perception node 222, a camera perception node 224, an inertial perception node 226, and/or a detection node 228. The mapping 204 nodes may include a localization node 240 and/or an HD map node 242. The planning/control 206 nodes may include a planning node 260, a control node 262, and/or a gateway node 264.

The nodes can communicate with each other by passing messages. Messages may be routed via an inter-process communication ("IPC") system with publish/subscribe semantics. In some embodiments, messages are published to particular message queues or "topics." Nodes can publish messages to one or more topics as long as the nodes are configured to generate messages of the particular type (e.g., data structure) for the given topic. Similarly, nodes can subscribe one or more topics as long as the nodes are configured to consume messages of the particular type for a given topic. Publishers need not be aware of which nodes are subscribing to the topic, and subscribers need not be aware of which nodes are publishing to the topic. A broker subsystem can be used to manage the distribution of messages to the nodes subscribing to particular topics.

In an illustrative example, the LiDAR perception node 220 may receive an input message from the LiDAR sensor 210. The LiDAR perception node 220 may perform processing on the input message, and generate an output message (e.g., an analysis of data from the LiDAR sensor 210). The LiDAR perception node 220 can publish the output message on a LiDAR perception topic. Any number of other nodes of the graph 200 may subscribe to messages on the LiDAR perception topic. For example, the HD map node 242 and planning node 260 may both subscribe to messages of the LiDAR perception topic. When the LiDAR perception node 220 publishes the message on the LiDAR perception topic, the broker can determine that the HD map node 242 and planning node 260 are subscribers to the topic and provide the message to the subscriber nodes.

The graph 200 does not necessarily need to receive input directly from live sensors in the sensor array 121. Rather, as long as the input data is structured correctly (e.g., provided using the data structure and data types expected by subscribing nodes), the graph 200 can process the input. This feature of the graph 200 can be leveraged to run simulations. For example, a developer may wish to test the effect that certain changes to the graph 200 will have on the output from the graph 200. By running simulations using the same input, the developer can observe the effect that individual changes to the graph 200 have on the processing performed by, and output from, the graph 200.

In some embodiments, the input for a simulation may be serialized data from the sensor array 121. For example, the sensor array 121 may be used to generate sensor data regarding real-world observations, such as those occurring during use of the vehicle 120. The sensor data may be serialized into a form that can be stored persistently. Then, the serialized data can be input into the graph 200 during one or more simulations to troubleshoot issues, test changes to the graph 200, etc.

Figure 3:
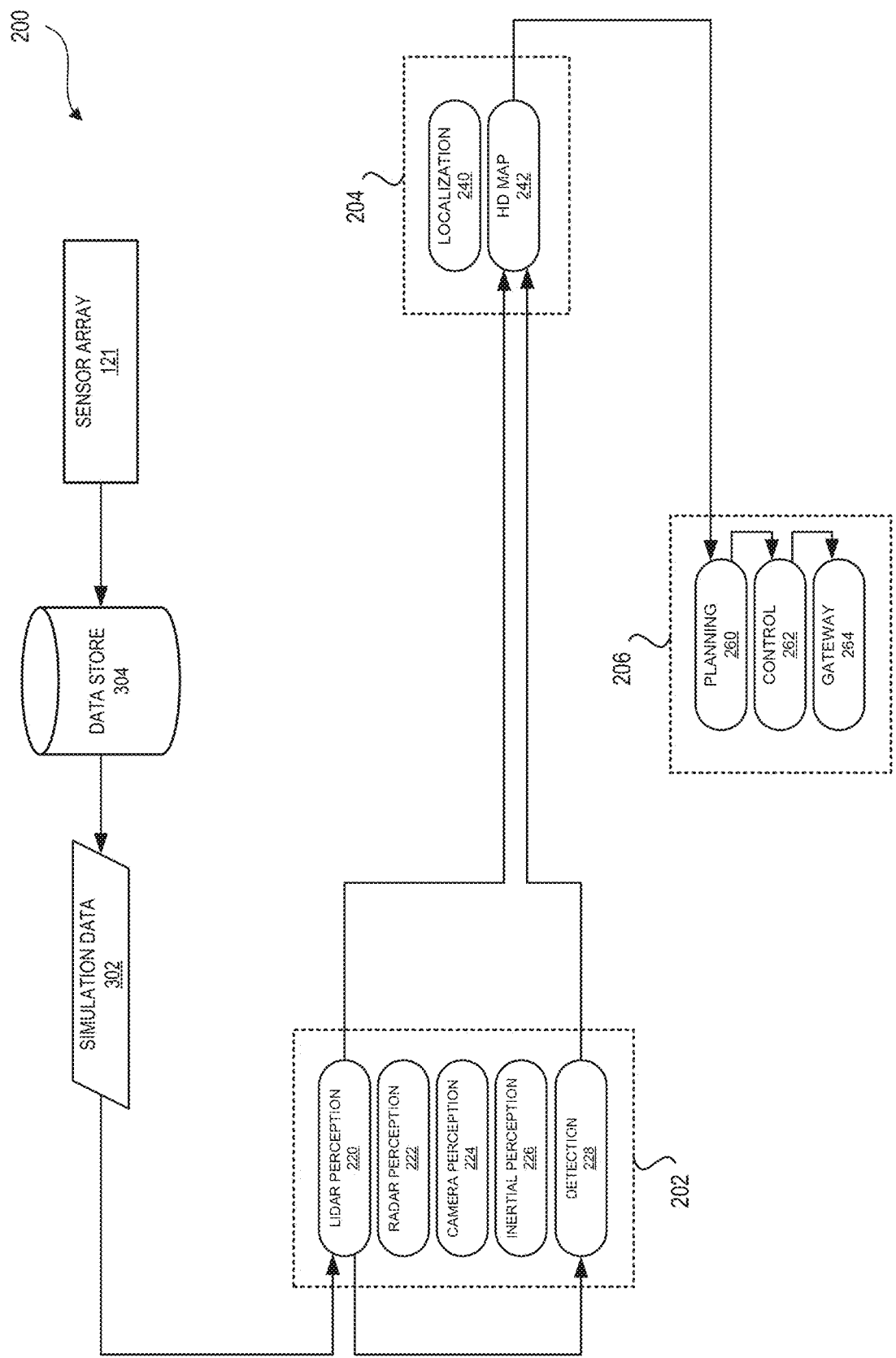
FIG. 3 illustrates a block diagram of a computation graph for processing simulated sensor data according to one embodiment.

FIG. 3 illustrates a block diagram of the computation graph 200 of FIG. 2 accepting stored input data rather than data directly from the sensor array 121. As shown, output from the sensor array 121 may be serialized or otherwise processed into a format that allows persistent storage in a data store 304. When a simulation is to be run, the serialized simulation data 302 may be loaded from the data store 304 and processed by the graph 200. Output data from the graph 200 may also be serialized into a form that can be stored persistently. Thus, output data from multiple different simulations can be analyzed to determine the effect that certain changes to the graph 200 have on the output generated from the same input data 302, the effect that changes to the input data 302 have on the output from the same graph 200, etc.

The distributed nature of the graph 200 provides robustness (e.g., individual nodes can fail and restart without causing the entire graph 200 to fail) and efficient processing (e.g., two or more nodes can execute concurrently). However, the distributed nature of the graph 200 also results in a non-deterministic system that can produce different output and/or follow a different sequence of operations from simulation to simulation, even when identical input data 302 is used. For example, if individual nodes are launched at slightly different times in different simulations (e.g., due to different degrees of system latency), the nodes may also begin publishing and subscribing to topics at different times. This may cause nodes to miss messages during some simulations, receive messages in different sequences from simulation to simulation, etc. As another example, different hardware may execute nodes at different speeds, which may also lead to the previously-discussed issues, among others. As a further example, jitter and communication latencies may result in different timestamps being used for time-stamped output data from simulation to simulation, even when the same input data 302 is processed by the same graph 200 on the same hardware. Each of these issues arises at least in part from the non-deterministic nature of the graph 200.

To address the issues discussed above, among others, various features may be implemented to facilitate deterministic execution of simulations. In some embodiments, individual nodes of the graph 200 may be separated into sub-graphs of smaller, simpler nodes, called nodelets. Like nodes, each nodelet may be an object that is executable independently of each other nodelet in a graph. Unlike nodes, however, nodelets may be restricted to a single thread. By restricting the operation of individual nodelets to a single thread, the entire graph may also be executed on single thread in a serial manner. In addition, the entire graph may be executed in a single process of a computing device. Accordingly, the non-deterministic issues that arise in multi-threaded asynchronous systems can be avoided, thereby facilitating deterministic simulations. Moreover, because the individual nodelets are executable independently of each other nodelet, a graph composed of such nodelets may also be executed in a multi-threaded asynchronous manner when such execution is desired (e.g., when operating in a live vehicle 120) or when deterministic execution is not required. Thus, a single graph composed of nodelets as described herein may operate in at least two different modes: a first operating mode or "production mode" in which the nodelets are executable asynchronously, and a second operating mode or "simulation mode" in which the nodelets are executed serially within a single thread according to a single timeline managed by the simulation system.

Figure 4:
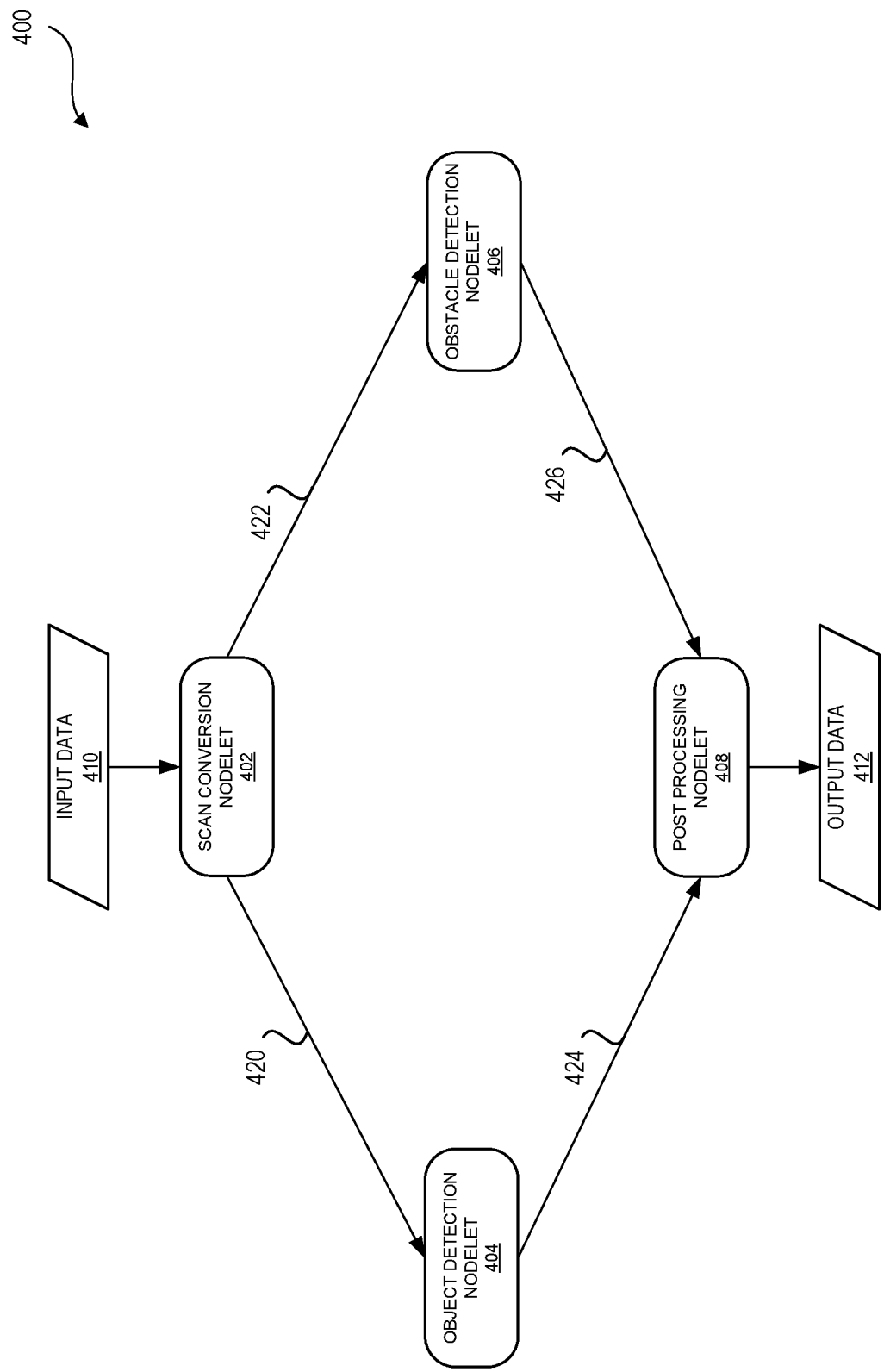
FIG. 4 illustrates a block diagram of a sub-graph with various nodelets and channels according to one embodiment.

FIG. 4 shows an example subgraph 400 of nodelets that implement the functionality of a single node from the graph 200. In the illustrated example, the subgraph 400 implements the functionality of the LiDAR perception node 220 as a subgraph of four nodelets: a conversion nodelet 402, an object detection nodelet 404, an obstacle detection nodelet 406, and a postprocessing nodelet 408. The implementation of multiple single-threaded nodelets allows the subgraph 400 itself to execute on a single thread within a single process. Because the individual nodelets may all execute in the same process, they can communicate without the overhead and latency of inter-process communications. Accordingly, the in-process communication between nodelets can further facilitate deterministic execution.

As shown, the scan conversion nodelet 402 may receive input 410. For example, the input 410 may be scan data generated by a LiDAR sensor 210. The input 410 may be published from the LiDAR sensor 210 and received by the scan conversion nodelet 402 (e.g., when the nodelet 402 is executing within a vehicle 120), or the input 410 may be obtained from serialized sensor data 302 (e.g., when the nodelet 402 is executing on a computing device separate from the vehicle 120 during a simulation). In either instance, the scan conversion nodelet 402 can perform an operation on the input data 410, such as converting it into a form that is usable by other nodelets of the subgraph 400. The scan conversion nodelet 402 can then provide its output to other nodelets of the subgraph 400. For example, the scan conversion nodelet 402 may send its output to one or more scan channels 420, 422.

Figure 5B:
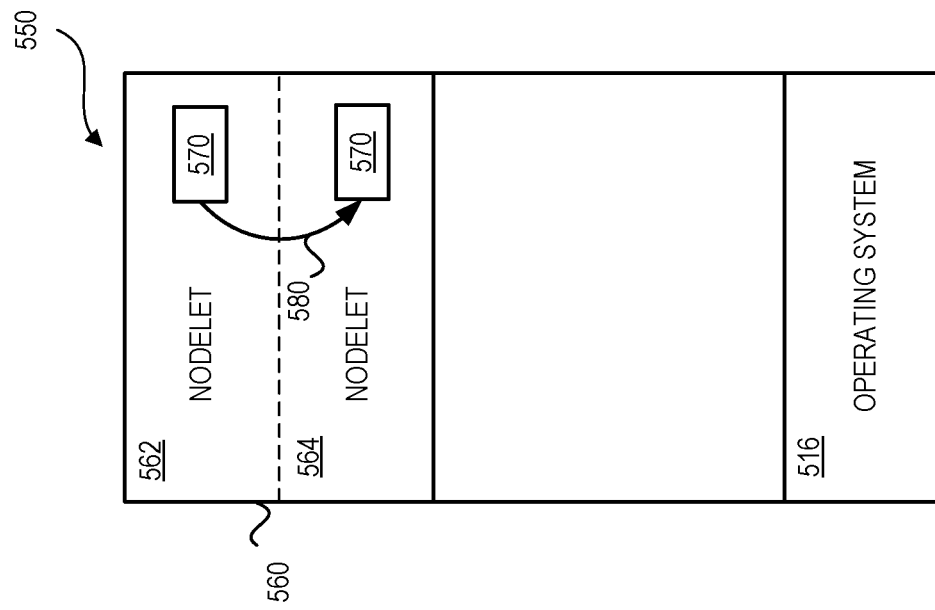
FIG. 5B illustrates a block diagram of a memory space with multiple portions of a single process communicating using in-process communication according to one embodiment.
Figure 5A:
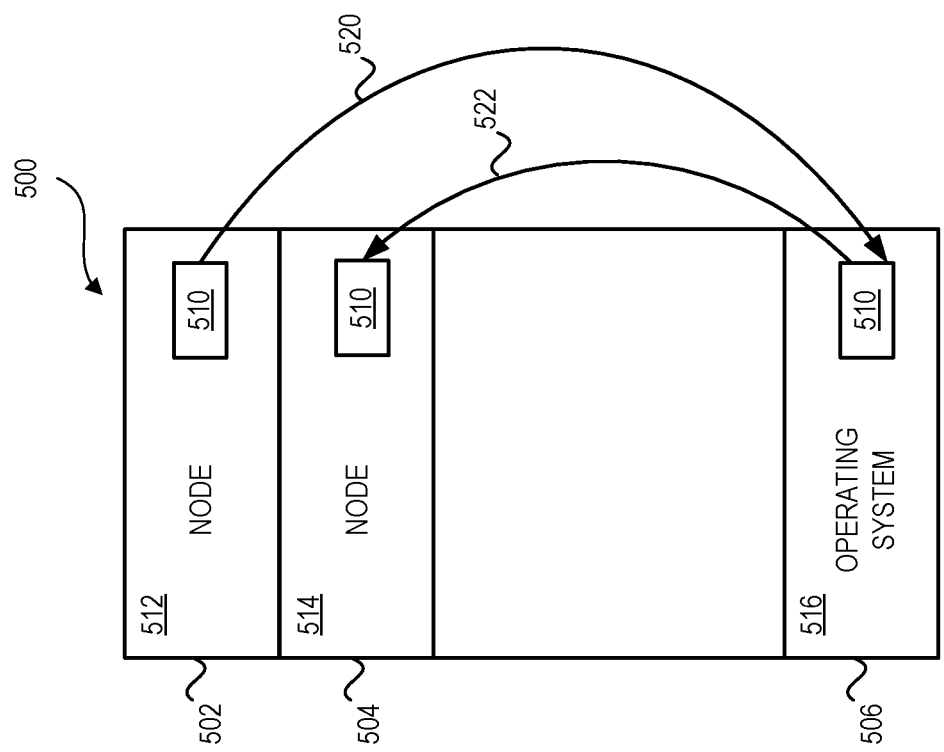
FIG. 5A illustrates a block diagram of a memory space with multiple processes communicating using inter-process communication according to one embodiment.

Sending and receiving data via the scan channels 420, 422 of the subgraph 400 may be more efficient, and introduce less communication latency, than the publishing method used by nodes running in separate processes. For example, when the nodelets 402, 404, 406, and 408 are all executing within a single process of a computing device, they may communicate with each other in a more direct manner than nodes that execute in separate processes and require inter-process communication. FIGS. 5A and 5B illustrate some differences between inter-process communication and in-process communication.

FIG. 5A shows the memory 500 of a computing device during execution of a computation graph 200 with nodes in different processes. A first portion 502 of the memory 500 is reserved for the process in which a first node 512 executes. A second portion 504 of the memory 500 is reserved for the process in which a second node 514 executes. A third portion 506 of the memory 500 is reserved for the process in which a broker (e.g., an operating system and/or a component executed by the operating system) 516 executes. When the first node 512 publishes a message 510 on a particular topic to which the second node 514 subscribes, an inter-process communication procedure occurs to provide the subscriber with the message. As shown, the message 510 is first serialized and copied at 520 to the third portion 506 of memory 500 in which the broker 516 executes. The broker 516 determines that the second node 514 subscribes to the topic to which the message 510 belongs. The message 510 is then copied at 522 to the second portion 504 of memory 500 in which the second node 514 executes. Such a procedure for inter-process communication can introduce latency into the execution of the graph 200. In addition, when there are thousands or millions (or more) of individual messages published during operation of the graph 200, performing the inter-process communication for each message can potentially introduce a highly variable amount of latency from simulation to simulation.

FIG. 5B shows the memory 550 of a computing device, such as the computing device 1000, executing a subgraph 400 with different nodelets in a single process. A portion 560 of the memory 550 is reserved for the process in which the entire subgraph 400 executes, including a first nodelet 562 and a second nodelet 564. The mechanism for communicating messages between the nodelets 562, 564 within the same process may be referred to as a channel. The process space 560 shown in FIG. 5B includes channel 580. When the first nodelet 562 generates a message 570 that the second nodelet 564 is to receive, the message 570 may sent via the channel 580 using an in-process communication. The channel 580 is directly accessible by the second nodelet 564 using an in-process communication.

Channels may provide communication of particular types of data (e.g., data meeting particular structural requirements), and different channels can communicate different types of data. Thus, channels can function as typed pipelines for asynchronous in-process communication. The messages sent to a particular channel may be stored in a queue. When the queue is full, the oldest message may be deleted when a new message is sent to the channel. In some embodiments, a new message may not be written to the channel until a space opens up in the queue. Because the messages are communicated within a single process, there is no need for a separate process to serve as the conduit for communications between processes. Moreover, the in-process communication used by the channels avoids the additional overhead that comes with communicating outside of the process (e.g., serialization, marshalling, context switching, etc.).

Returning to FIG. 4, the subgraph 400 has four channels: a first and second scan channel 420, 422 for sending pre-processed scan data from the scan conversion nodelet 402 to other nodelets; an object channel 424 for sending data regarding detected objects from the object detection nodelet 404 to the post processing nodelet 408; and an obstacle channel 426 for sending data regarding detected obstacles from the obstacle detection nodelet 406 to the post processing nodelet 408.

As discussed above, any given node of a graph 200 may be implemented as a subgraph of nodelets that can execute serially within a single thread when desired. Thus, the graph 200 shown in FIGS. 2 and 3 may be implemented as a collection of several subgraphs, which may collectively be referred to as the graph 200 for convenience. The implementation of the graph 200 using nodelets that can execute serially within a single thread facilitates deterministic execution of the graph 200, which is desirable when running simulations. Additional features may also be implemented to facilitate deterministic execution for simulations. For example, a task scheduler may interleave the operations of the multiple nodelets such that individual nodelets execute within discrete, serially-occurring execution frames (also referred to simply as "frames"), and then wait for the next frame to be assigned by the task scheduler. In addition, the task scheduler may use a simulated system clock to schedule the individual frames and to ensure that any timestamped data generated during a frame will be timestamped with the same time from simulation to simulation, regardless of any latencies or jitter that may be inherent in the system. This combination of features collectively allows simulations to be performed in a deterministic manner, in contrast to asynchronous execution of the graph 200 with nodes, inter-process communications, a system clock that advances continuously in real time, and the like.

Figure 6:
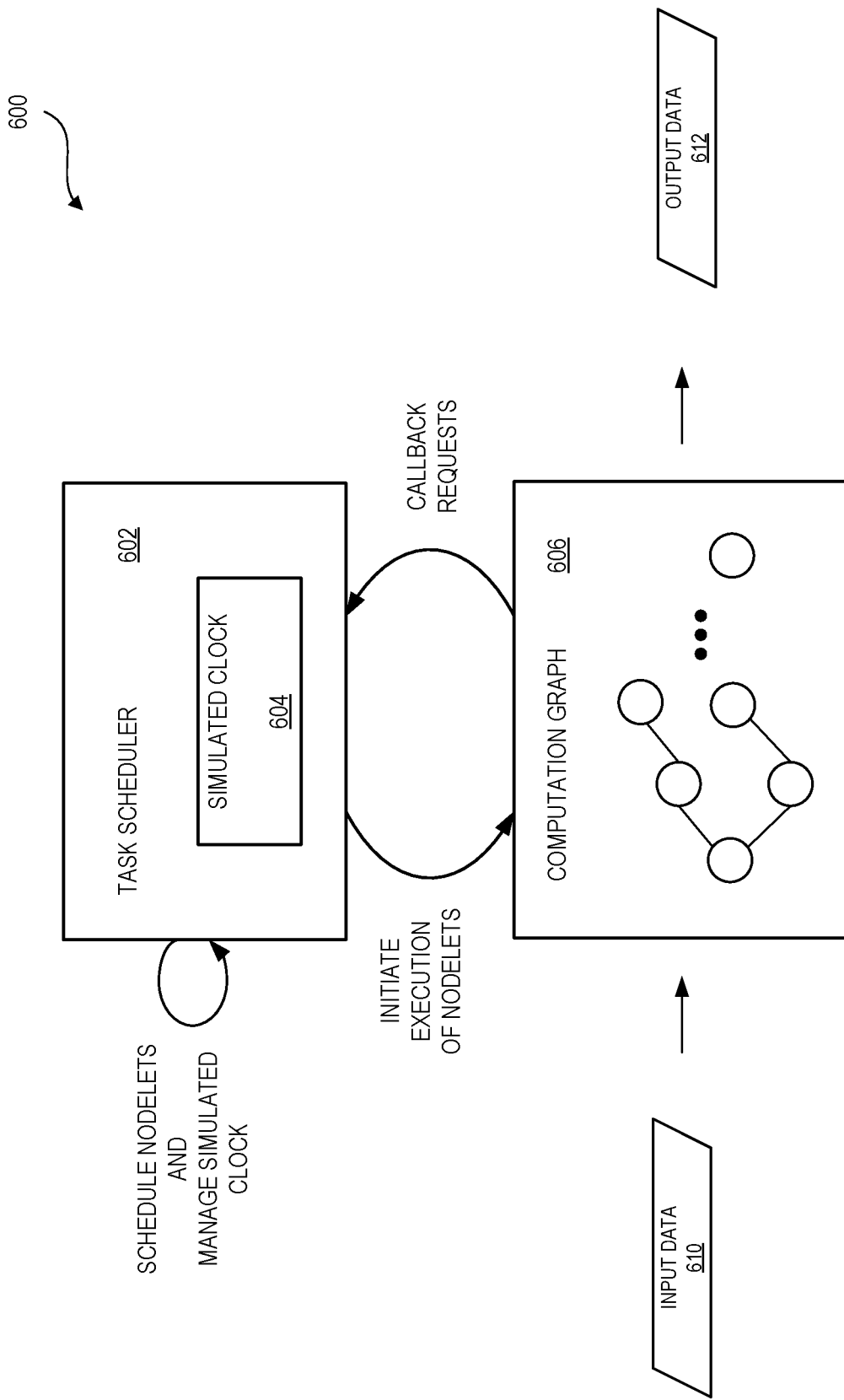
FIG. 6 illustrates a block diagram of various components of a deterministic simulation system configured to perform simulated processing using a nodelet-based computation graph according to one embodiment.

FIG. 6 shows an illustrative embodiment of a deterministic simulation system 600 in which a computation graph may be executed in a deterministic manner for simulations. The system 600 may be configured to execute an instance of the same vehicle-based processing system (or components thereof) that is executed by the vehicle 120. Thus, the vehicle-based processing system can be tested using any number of simulations, with any number of modifications to input data and/or subsystems, without necessarily requiring the use of, or access to, the vehicle 120 and sensor array 121 to perform the simulations. In some embodiments, as shown, the system 600 includes a task scheduler or manager 602 with a simulated system clock 604, and an instance of a computation graph 606 consisting of nodelets configured to operate serially in a single thread. The system 600 accepts input 610, such as serialized sensor data, and produces output 612. Because the system 600 is deterministic, it may be used to run simulations in which individual changes to the input 610, the graph 606, and/or the hardware on which the system 600 executes can be analyzed with respect to the effect the changes may have on the output 612 that is generated.

Figure 7:
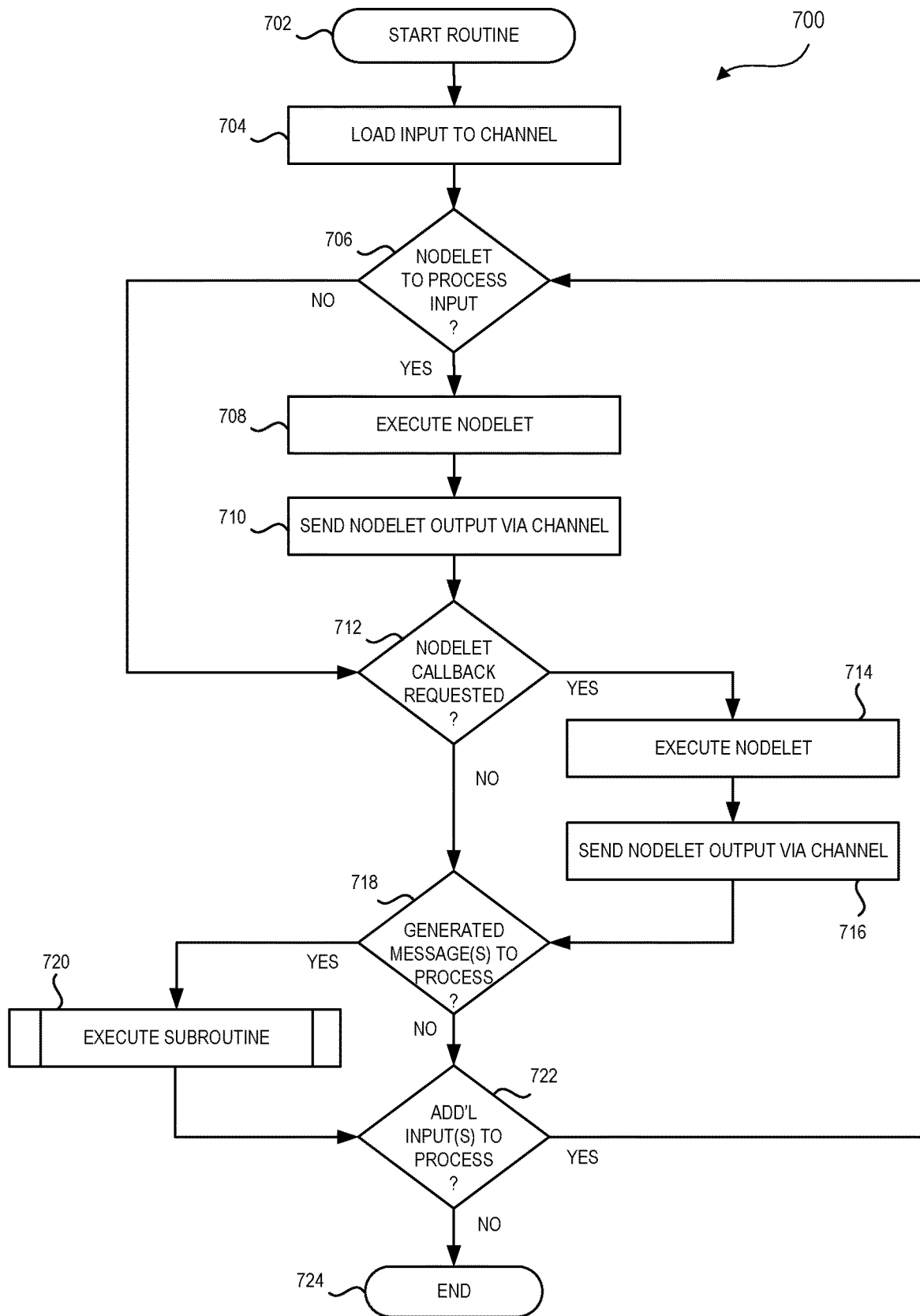
FIG. 7 illustrates a flow diagram of a routine for scheduling nodelet processing tasks according to one embodiment.

FIG. 7 is a flow diagram of an illustrative routine 700 for scheduling nodelet processing during a simulation. A task scheduler, such as the task scheduler 602 shown in FIG. 6, may perform the routine 700 to manage a simulation in which the graph 606 processes input data 610. Advantageously, the task scheduler 602 can schedule the operations to be performed by the nodelets of the graph 606 in a synchronous manner, to occur within discrete serially-occurring frames of an execution timeline. The routine 700 will be described with further reference to FIG. 8, which is a block diagram of a timeline showing serial scheduling and execution of nodelet operations in discrete frames.

The routine 700 begins at block 702. The routine 700 may begin in response to an event, such as when a simulation is scheduled to begin, when the task scheduler 602 is launched, when input data 610 is obtained, etc. When the routine 700 is initiated, a set of executable program instructions stored on one or more non-transitory computer-readable media (e.g., hard drive, flash memory, removable media, etc.) may be loaded into memory (e.g., random access memory or "RAM") of a computing device, such as the computing device 1000 shown in FIG. 10. The executable instructions may then be executed by a hardware-based computer processor (e.g., a central processing unit or "CPU") of the computing device.

At block 704, input may be loaded from the input data 610 to one or more channels. The input data 610 may include messages previously generated by sensors of the sensor array 121, messages generated to simulate output of the sensor array 121, some combination thereof, etc. The messages may be timestamped or sequentially arranged such that they can be processed by the graph 606 and published to channels in a particular sequence. In some embodiments, a program or nodelet may be implemented to load messages from the input data 610 into various channels according to the timestamps for the messages, to simulate the operation of the sensor array 121. The task scheduler 602 can determine the timestamp associated with the message loaded to the channel, and set the simulated clock 604 to the time corresponding to the timestamp. The simulated clock 604 can then maintain that time until the task scheduler 602 sets the simulated clock 604 to a different value.

Figure 8:
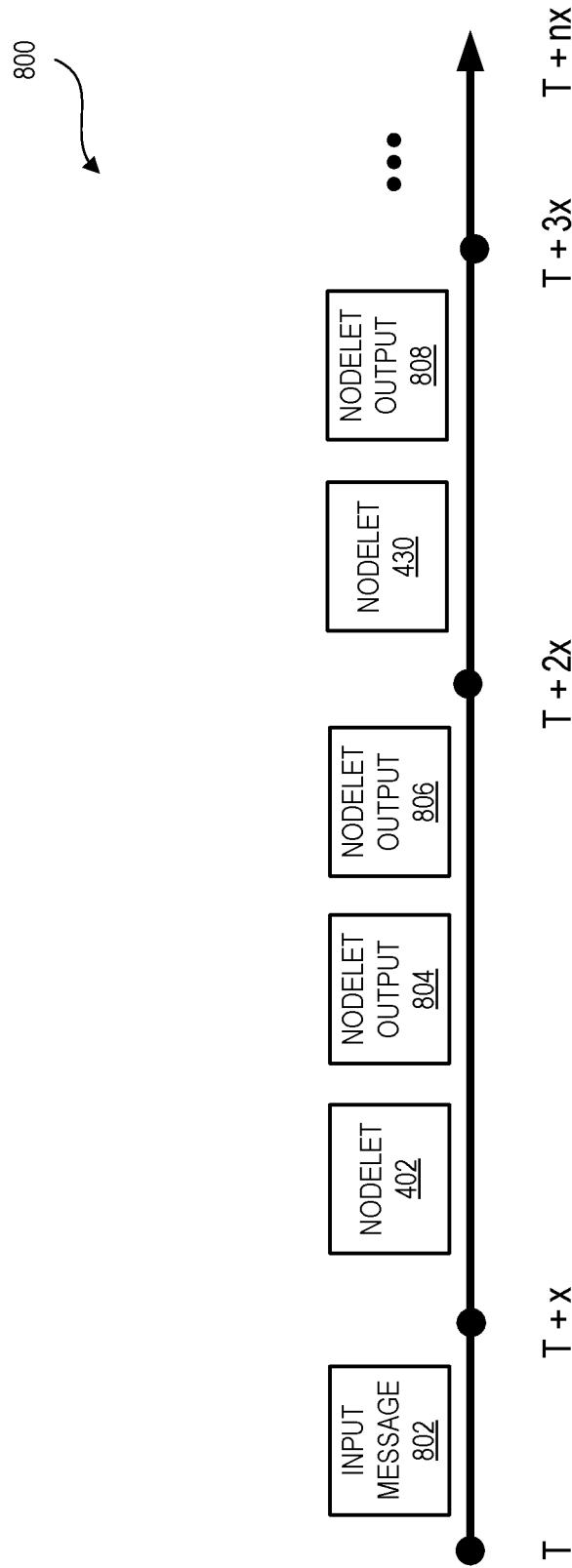
FIG. 8 illustrates a timeline of nodelet execution as scheduled by a task scheduler using a simulated clock according to one embodiment.

FIG. 8 shows a timeline 800 that begins at a time T. At time T, a message 802 is sent to a particular channel. Thus, time T may correspond to the timestamp of the message 802. In the illustrated example, the message 802 is a LiDAR scan message and is sent to a channel for communication to a nodelet that receives such messages (e.g., the scan conversion nodelet 402).

Returning to FIG. 7, at decision block 706 the task scheduler 602 can determine whether there is a nodelet that is to process the most-recently generated message 802. For example, the task scheduler 602 can determine whether one or more nodelets receive messages via one of the channels to which the message 802 was sent. If so, the routine 700 can proceed to block 708. Otherwise, the routine 700 can proceed to block 712. In the present example, the task scheduler 602 may determine that nodelet 402 is to receive and process the message 802. Thus, the routine 700 proceeds to block 708.

At block 708, a nodelet can execute an operation in response to the message. In the present example, nodelet 402 may be executed. Execution of the nodelet 402 may be in response to a callback from the task scheduler 602, notifying the nodelet 402 of the message 802. The task scheduler 602 may increment the simulated clock 604 to T+x, where x is an increment used by the task scheduler 602 to assign serially-occurring frames to individual nodelets. In the present example shown in FIG. 8, no nodelet other than nodelet 402 may be executing during the frame beginning at T+x. In some embodiments, the simulated clock 604 is not advanced until after all of the nodelets that are to process the message 802 have completed processing, or until after the occurrence of some other event. In these cases, even though the simulated clock 604 may not advance for each frame, the frames may still be scheduled serially and only one nodelet may be executed during any given frame.

At block 710, the nodelet that is currently executing can generate a message or otherwise yield back to the task scheduler 602 so that another nodelet may perform operations on the serial timeline. In the present example shown in FIG. 8, the nodelet 402 can generate messages 804 and 806. Illustratively, messages 804 and 806 may be sent to the scan channels 420 and 422, respectively, of subgraph 400. The process 700 may then return to decision block 706 to determine whether the message 802 has been sent to any other channels.

At decision block 712, the task scheduler 602 can determine whether there are any nodelets that have requested callbacks according to a particular schedule. For example, some nodelets may perform a discrete unit of work and then wait for a predetermined or dynamically determined period of time before performing another discrete unit of work. Such nodelets may request a callback from the task scheduler 602 when they are to "wake up" and perform work. If the task scheduler 602 determines that there are any nodelets that have requested a callback on or before the current value of the simulated clock, the routine 700 may proceed to block 714. Otherwise, the routine 700 may proceed to decision block 718. In the example shown in FIG. 8, a different nodelet 430 may have requested a callback during a time corresponding to the current value of the simulated clock 604 (e.g., a time on or before the current time represented by the simulated clock 604). Thus, the routine 700 proceeds to block 714.

At block 714, a nodelet can execute an operation in response to the callback from the task scheduler 602. In the present example, nodelet 430 can execute to process a previously received or generated message, and/or to perform some other operation. The task scheduler 602 may increment the simulated clock 604 to T+2x. In the present example, only nodelet 430 may be running during the frame beginning at time T+2x. In some embodiments, the simulated clock 604 is not advanced until after all of the callbacks that are scheduled to occur on or before time T+x have completed processing, or until after the occurrence of some other event At block 716, the nodelet that is currently executing can generate a message or otherwise yield back to the task scheduler so that another nodelet may perform operations on the serial timeline. In the present example, the nodelet 430 can generate a message 808.

At decision block 718, the task scheduler 602 can determine whether channels have pending messages to be processed during the current iteration of the routine 700 (e.g., messages sent to channels at blocks 710 and/or 716). If so, the routine 700 can proceed to block 720 for processing of the messages.

At block 720, the task scheduler 602 may execute a subroutine—including blocks 706 to 720, as necessary—for each of the channels that have had messages added to them during the current iteration of the routine 700. Block 720 may be performed iteratively and/or recursively, as necessary, until all messages generated during the current iteration of the routine 700 have been processed or until the occurrence of some other event. In the present example, block 720 may be executed for each of the messages 804, 806, and 808 shown in FIG. 8 and described above. Illustratively, the other nodelets of the subgraph 400 may process messages 804 and 806 to generate LiDAR perception output data 412, such as data regarding detected objects, pedestrians, vehicles, and the like. The output may itself be sent to a channel where it is provided to other nodelets, and block 720 may be executed for that channel as needed.

At decision block 722, the task scheduler 602 can determine whether there are any additional input messages to be loaded. If so, the routine 700 can return to block 704. Otherwise, the routine 700 may terminate at block 724.

The illustrative routine 700 is an example of the processing performed by the system 600 during a simulation, and is not intended to be exhaustive or limiting. In some embodiments, certain blocks of the routine 700 may be performed in a different order, repeated, replaced, or excluded.

Figure 9:
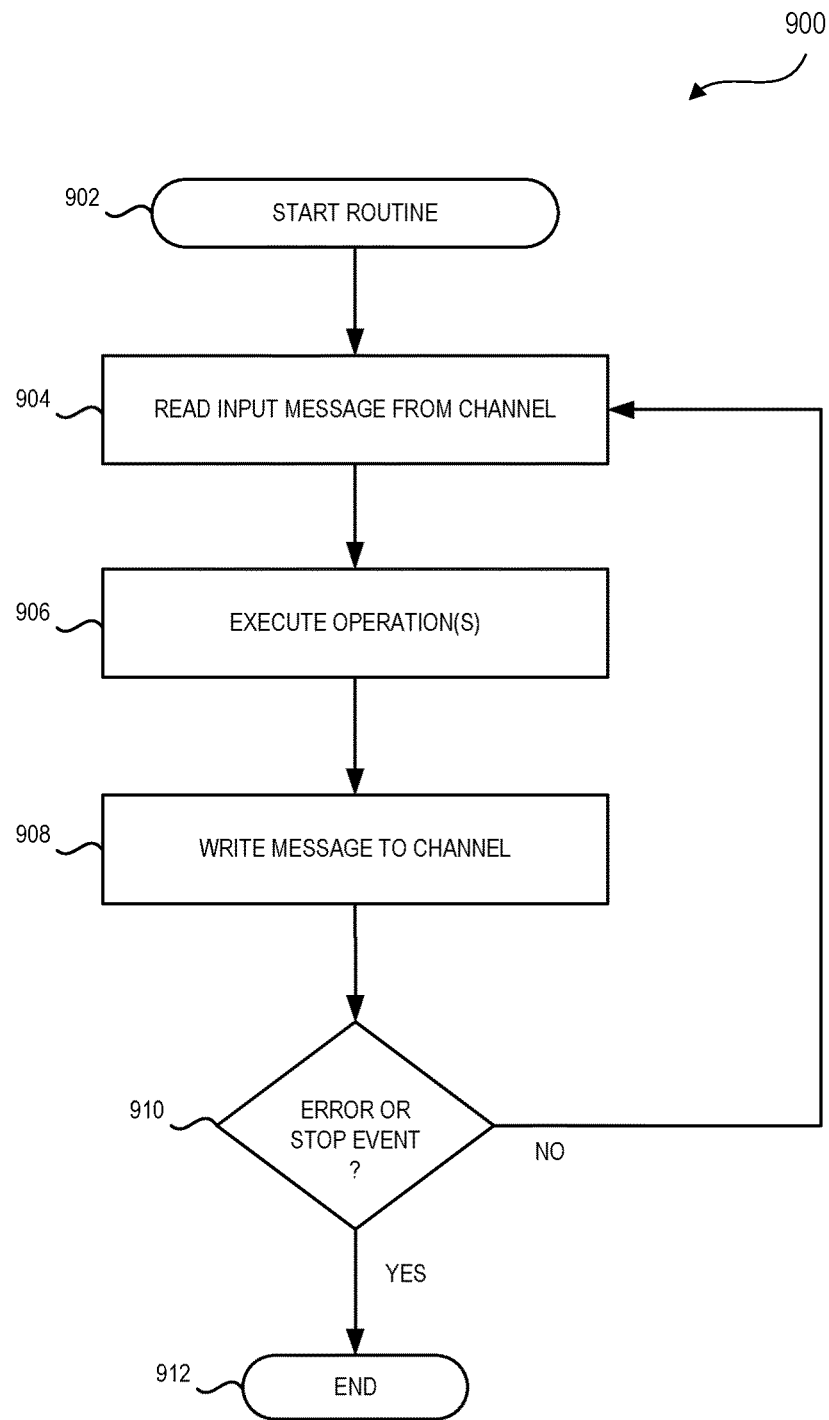
FIG. 9 illustrates a flow diagram of a routine for executing a nodelet according to one embodiment.

FIG. 9 is a flow diagram of an illustrative routine 900 executed by a nodelet. The routine 900 may be embodied in executable program instructions stored on one or more non-transitory computer-readable media (e.g., hard drive, flash memory, removable media, etc.). When the routine 900 is executed (or when the graph 606 is executed, or when the system 600 begins a simulation, or in response to some other event), the executable instructions may be loaded into memory (e.g., random access memory or "RAM") of a computing device, such as the computing device 1000 shown in FIG. 10. The executable instructions may be executed by a hardware-based computer processor of the computing device.

The routine 900 begins at block 902. The routine 900 may begin in response to an event, such as when a callback to a nodelet is performed. For example, the routine 900 may be performed by nodelets executing during blocks 708 and/or 714 of the routine 700.

At block 904, the nodelet may read a message for processing. The message may have been written directly to a memory location used to store input, output, and/or state data for the nodelet. The memory location may be in a portion of the memory space that has been allocated to the process in which the graph 606 executes. Illustratively, the message may have been generated by another nodelet of the graph 606, and communicated using a channel. In some embodiments, the read operation may be a blocking operation. For example, the portion of memory space for messages from the channel may be locked whenever a message is being written, and whenever the nodelet is reading the memory space. Thus, execution of the nodelet may be stopped for a period of time if data is being written to the portion of memory.

At block 906, the nodelet can perform one or more operations. The operations may differ from nodelet to nodelet. For example, the object detection nodelet 404 may perform different processing and detection functions than the obstacle detection nodelet 406, and both nodelets may perform different functions than the postprocessing nodelet 408. During a simulation performed by the deterministic simulation system 600, no nodelet may be permitted to execute during the time that another nodelet is performing operations at block 906. However, during production use (e.g., when the graph 606 is executed in a vehicle 120 to process data from the sensor array 121), any number of other nodelets may be executing the routine 900 or portions thereof while another nodelet is executing block 906. In some embodiments, a nodelet may be permitted to use multiple threads (e.g., to "spawn" one or more threads) during processing at block 906. However, in order to ensure the deterministic character of the graph 606 during simulations, the nodelet may not be permitted to end execution and yield to the next nodelet until all threads have completed and execution has returned fully to the main thread on which the nodelet is executing. This requirement can help to prevent execution of another nodelet from beginning while operations of a prior nodelet are still being performed, which would otherwise be possible if a nodelet could spawn threads and cease execution before the spawned threads completed.

At block 908, the nodelet may write a message to a channel or otherwise generate output. The message may be written to a memory location used to store input, output, and/or state data for a different nodelet. In some embodiments, the write operation may be a blocking operation. For example, the portion of memory space for messages to the channel may be locked whenever a message is being written, and whenever the other nodelet is reading the memory space. Thus, execution of the nodelet may be stopped for a period of time if data is being written to or read from the portion of memory.

At decision block 910, the nodelet can determine whether an error has occurred, or whether some other stop event has occurred. For example, a processing error or data access error may have occurred, and the nodelet may not be able to recover from the error while maintaining the deterministic manner of the simulation. As another example, the task scheduler 602 may instruct the nodelet to stop executing. If no such event has occurred, the routine 900 may return to block 904 to read a next message (if any) from a channel. Otherwise, if a stop event has occurred, the routine 900 may terminate at 912.

Figure 10:
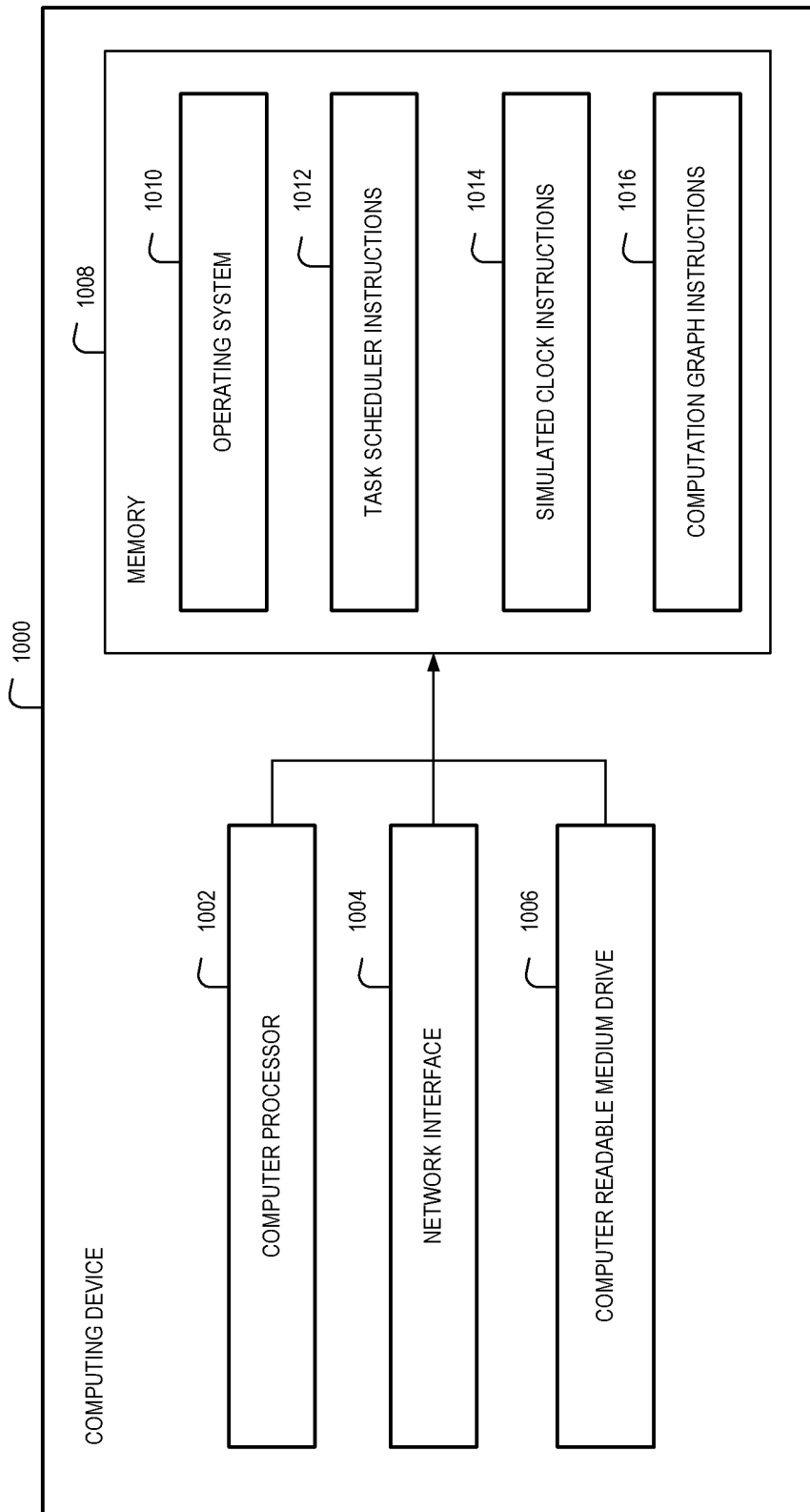
FIG. 10 illustrates a block diagram of a computing system configured to implement aspects of the present disclosure according to one embodiment.

FIG. 10 shows components of an illustrative computing device 1000 configured to implement aspects of the present disclosure. In some embodiments, as shown, the computing device 1000 may include: one or more computer processors 1002, such as physical central processing units ("CPUs"); one or more network interfaces 1004, such as a network interface cards ("NICs"); one or more computer readable medium drives 1006, such as a high density disk ("HDDs"), solid state drives ("SSDs"), flash drives, and/or other persistent non-transitory computer-readable media; and one or more computer readable memories 1008, such as random access memory ("RAM") and/or other volatile non-transitory computer-readable media. The computer readable memory 1008 may include computer program instructions that the computer processor 1002 executes in order to implement one or more embodiments. For example, the computer readable memory 1008 can store an operating system 1010 that provides computer program instructions for use by the computer processor 1002 in the general administration and operation of the computing device 1000. The computer readable memory 1008 may also include task scheduler instructions 1012 for implementing the task scheduler 602. The computer readable memory 1008 may also include simulated clock instructions 1014 for implementing the simulated clock 604. The computer readable memory 1008 may also include computation graph instructions 1016 for implementing the computation graph 606. In some embodiments, the computing system 1000 may also include or be in communication with various other computing devices, data stores, and the like.

In regard to the figures described herein, other embodiments are possible, such that the above-recited components, steps, blocks, operations, and/or messages/requests/queries/instructions are differently arranged, sequenced, sub-divided, organized, and/or combined. In some embodiments, a different component may initiate or execute a given operation.

Example Embodiments

Some example enumerated embodiments are recited in this section in the form of methods, systems, and non-transitory computer-readable media, without limitation.

One aspect of the disclosure provides a system for deterministic simulation of distributed processing. The system comprises a computer-readable memory and one or more processors in communication with the computer readable memory. The one or more processors are configured to at least: load, into a portion of the computer-readable memory allocated to a single process, a computation graph comprising a plurality of executable nodelets, wherein the plurality of executable nodelets are configured to execute in a simulation mode in which the plurality of executable nodelets executes serially to process simulation data representing output of one or more sensors, and wherein the plurality of executable nodelets are further configured to execute in a production mode in which two or more nodelets of the plurality of executable nodelets execute concurrently to process sensor data received from the one or more sensors; schedule execution of the plurality of executable nodelets in the simulation mode, wherein the plurality of executable nodelets are scheduled to execute serially; establish a channel for in-process communication to a first nodelet of the plurality of executable nodelets; and send in-process data to the first nodelet using the channel, wherein the in-process data is generated by a second nodelet based at least partly on the simulation data, and wherein the channel copies the in-process data from a first location of the portion of the computer-readable memory allocated to the process to a second location of the portion of the computer-readable memory allocated to the process.

The system of the preceding paragraph can include any sub-combination of the following features: where the computation graph comprises at least a portion of a vehicle control system; wherein the one or more sensors include at least one of: a LiDAR sensor, a RADAR sensor, an inertial sensor, or a camera; wherein the one or more processors are further configured to at least determine that a new in-process communication is to be sent using the channel, determine, during the production mode, that a queue associated with the channel is full, and overwrite an oldest in-process communication in the queue with the new in-process communication; wherein the one or more processors are further configured to at least determine that a new in-process communication is to be sent using the channel, determine, during the simulation mode, that a queue associated with the channel is full, and delay adding the new in-process communication to the queue until there is space in the queue for the new in-process communication; wherein each nodelet of the plurality of executable nodelets is configured to receive in-process data using at least one channel of a plurality of channels of the commutation graph; and wherein the one or more processors are further configured to at least load an input data item from the simulation data, determine a first timestamp associated with the input data item, set a simulated clock to a time represented by the first timestamp, and schedule execution of the second nodelet based at least partly on the time, wherein the simulated clock maintains the time represented by the first timestamp during execution of the second nodelet, and wherein the second nodelet uses the simulated clock to generate a second timestamp associated with the in-process communication generated by the second nodelet Another aspect of the disclosure provides a computer-implemented method executed under control of a computing system comprising a computer processor configured to execute specific instructions. The computer-implemented method includes: loading a plurality of subsystems into a portion of computer-readable memory allocated to a single process, wherein the plurality of subsystems are configured to operate in a first operating mode in which the plurality of subsystems executes only serially to process simulated sensor data, and in a second operating mode in which two or more subsystems of the plurality of subsystems execute concurrently to process sensor data; scheduling execution of the plurality of subsystems in the first operating mode; establishing a channel for communication to a first subsystem of the plurality of subsystems; and sending in-process data to the first subsystem using the channel, wherein the in-process data is generated by a second subsystem of the plurality of subsystems based at least partly on the simulated sensor data, and wherein the channel copies the in-process data from a first location of the portion of the computer-readable memory allocated to the process to a second location of the portion of the computer-readable memory allocated to the process.

The computer-implemented method of the preceding paragraph can include any sub-combination of the following features: determining that a new in-process communication is to be sent using the channel, determining, during the first operating mode, that a queue associated with the channel is full, and delaying adding the new in-process communication to the queue until there is space in the queue for the new in-process communication; determining that a new in-process communication is to be sent using the channel, determining, during the second operating mode, that a queue associated with the channel is full, and overwriting an oldest in-process communication in the queue with the new in-process communication; loading an input data item from the simulated data, determining a first timestamp associated with the input data item, and setting a simulated clock to a time represented by the first timestamp; and scheduling execution of the second subsystem based at least partly on the time, wherein the simulated clock maintains the time represented by the first timestamp during execution of the second subsystem, and wherein the second subsystem uses the simulated clock to generate a second timestamp associated with the in-process data generated by the second subsystem.

A further aspect of the disclosure provides a system comprising a computer-readable memory and one or more processors in communication with the computer readable memory. The one or more processors are configured to at least: load a plurality of subsystems into a portion of the computer-readable memory allocated to a single process, wherein the plurality of subsystems are configured to operate in a first operating mode in which the plurality of subsystems executes only serially to process simulated sensor data, and in a second operating mode in which two or more subsystems of the plurality of subsystems execute concurrently to process sensor data; schedule execution of the plurality of subsystems in the first operating mode; establish a channel for communication to a first subsystem of the plurality of subsystems; and send in-process data to the first subsystem using the channel, wherein the in-process data is generated by a second subsystem of the plurality of subsystems based at least partly on the simulated sensor data, and wherein the channel copies the in-process data from a first location of the portion of the computer-readable memory allocated to the process to a second location of the portion of the computer-readable memory allocated to the process.

The system of the preceding paragraph can include any sub-combination of the following features: wherein the plurality of subsystems comprises at least a portion of a vehicle control system; wherein the sensor data is generated by at least one of: a LiDAR sensor, a RADAR sensor, an inertial sensor, or a camera; wherein each subsystem of the plurality of subsystems is configured to receive in-process data using at least one channel of a plurality of channels; wherein the one or more processors are further configured to at least determine that a new in-process communication is to be sent using the channel, determine, during the first operating mode, that a queue associated with the channel is full, and delay adding the new in-process communication to the queue until there is space in the queue for the new in-process communication; wherein the one or more processors are further configured to at least determine that a new in-process communication is to be sent using the channel, determine, during the second operating mode, that a queue associated with the channel is full, and overwrite an oldest in-process communication in the queue with the new in-process communication; wherein the one or more processors are further configured to at least load an input data item from the simulated data, determine a first timestamp associated with the input data item, and set a simulated clock to a time represented by the first timestamp; and wherein the one or more processors are further configured to at least schedule execution of the second subsystem based at least partly on the time, wherein the simulated clock maintains the time represented by the first timestamp during execution of the second subsystem, and wherein the second subsystem uses the simulated clock to generate a second timestamp associated with the in-process data generated by the second subsystem.

Yet another aspect of the present disclosure provides a system comprising a first computing device comprising a first instance of a vehicle-based processing system. The first computing device is configured to at least: receive sensor data from one or more sensors coupled to the first computing device; identify at least a first subsystem and a second subsystem, of a plurality of subsystems of the first instance of the vehicle-based processing system, that are to be executed based at least partly on receiving the sensor data; and execute the first subsystem and the second subsystem concurrently, wherein the first subsystem generates first output based at least partly on the sensor data, and wherein the second subsystem generates second output based at least partly on sensor data. The system further comprises a second computing device comprising a second instance of the vehicle-based processing system. The second computing device is configured to at least: receive simulated sensor data representing data generated by one or more sensors; identify at least a third subsystem and a fourth subsystem, of a plurality of subsystems of the second instance of the vehicle-based processing system, that are to be executed based at least partly on receiving the simulated sensor data; and schedule execution of the third subsystem and the fourth subsystem, wherein the third subsystem is required to complete execution prior to execution of the fourth subsystem being initiated, wherein the third subsystem generates third output based at least partly on the simulated sensor data, and wherein the fourth subsystem generates fourth output based at least partly on the simulated sensor data.

The system of the preceding paragraph can include any sub-combination of the following features: wherein the first computing device comprises an onboard computing device of a vehicle, and wherein the second computing device comprises a user device separate from the vehicle; wherein the user device is configured to execute the second instance of the vehicle-based processing system as a deterministic simulation of the first instance of the vehicle-based processing system executing on the onboard computing device of the vehicle; wherein the first subsystem of the first instance corresponds to the third subsystem of the second instance, and wherein the second subsystem of the first instance corresponds to the fourth subsystem of the second instance; wherein the simulated sensor data comprises a copy of the sensor data.

Another aspect of the present disclosure provides a computer-implemented method executed under control of a computing system configured to execute specific instructions. The computer-implemented method includes receiving input data simulating output of a vehicle-based sensor; determining that a first nodelet, of a vehicle-based processing system comprising a plurality of executable nodelets, is to perform a first operation using the input data; determining that a second nodelet of the vehicle-based processing system is to perform a second operation using the input data, wherein the second nodelet is configured to operate independently of the first nodelet; scheduling the first nodelet to perform the first operation during a first period of time, wherein no other nodelet of the plurality of executable nodelets is permitted to execute during the first period of time; scheduling the second nodelet to perform the second operation during a second period of time following the first period of time, wherein no other nodelet of the plurality of executable nodelets is permitted to execute during the second period of time; executing the first nodelet to perform the first operation during the first period of time, wherein the first operation generates output data to be processed by a third nodelet of the plurality of executable nodelets; scheduling the third nodelet to perform a third operation during a third period of time following the second period of time; executing the second nodelet to perform the second operation during the second period of time; and executing the third nodelet to perform the third operation during the third period of time.

The computer-implemented method of the preceding paragraph can include any sub-combination of the following features: setting a time of a simulated clock based on the input data, wherein the simulated clock remains static during execution of the first nodelet, and advancing the time of the simulated clock based at least partly on execution of the first nodelet completing, wherein the simulated clock remains static during execution of the second nodelet; setting a time of a simulated clock based on the input data, wherein the simulated clock remains static during execution of both first nodelet and the second nodelet; wherein the first nodelet, second nodelet, and third nodelet are executed on a single thread; wherein executing the first nodelet comprises using a second thread to perform a function initiated by the first nodelet, wherein execution of the first nodelet is not permitted to end until the function has completed execution on the second thread; copying the output data from a first memory location associated with the first nodelet to a second memory location associated with the third nodelet, wherein both the first memory location and the second memory location are in a portion of memory allocated to a single process of the computing system; and wherein receiving the input data simulating output of the vehicle-based sensor comprises receiving data representing a message previously generated by one of: a LiDAR sensor, a RADAR sensor, an inertial sensor, or a camera.

A further aspect of the present disclosure provides a system comprising a computer-readable memory and one or more processors in communication with the computer readable memory. The one or more processors are configured to at least: receive input data simulating output of a vehicle-based sensor; determine that a first subsystem, of a vehicle-based processing system comprising a plurality of subsystems, is to perform a first operation using the input data; determine that a second subsystem of the vehicle-based processing system is to perform a second operation using the input data, wherein the second subsystem is configured to operate independently of the first subsystem; schedule the first subsystem to perform the first operation during a first period of time, wherein no other subsystem of the plurality of subsystems is permitted to execute during the first period of time; schedule the second subsystem to perform the second operation during a second period of time following the first period of time, wherein no other subsystem of the plurality of subsystems is permitted to execute during the second period of time; execute the first subsystem during the first period of time; and execute the second subsystem during the second period of time.

The system of the preceding paragraph can include any sub-combination of the following features: wherein one or more processors are further configured to at least schedule a third subsystem of the plurality of subsystems to perform a third operation during a third period of time following the second period of time, wherein the first operation generates output data to be processed by the third subsystem, and execute the third subsystem during the third period of time; wherein the one or more processors are further configured to at least copy the output data from a first memory location associated with the first subsystem to a second memory location associated with the third subsystem, wherein both the first memory location and the second memory location are in a portion of memory allocated to a single process; wherein the input data simulates output of one of: a LiDAR sensor, a RADAR sensor, an inertial sensor, or a camera; wherein one or more processors are further configured to at least set a time of a simulated clock based on the input data, wherein the simulated clock remains static during execution of the first subsystem, and advance the time of the simulated clock based at least partly on execution of the first subsystem completing, wherein the simulated clock remains static during execution of the second subsystem; wherein one or more processors are further configured to at least set a time of a simulated clock based on the input data, wherein the simulated clock remains static during execution of both the first subsystem and the second subsystem; wherein the first subsystem and the second subsystem are executed on a single thread; and wherein executing the first subsystem comprises using a second thread to perform a function initiated by the first subsystem, wherein execution of the first subsystem is not permitted to end until the function has completed executing on the second thread.

Yet another aspect of the present disclosure provides a system comprising a first computing device configured to at least: execute a first instance of a vehicle-based processing system comprising a plurality of subsystems; receive sensor data from one or more sensors coupled to the first computing device; identify at least a first subset of the plurality of subsystems, wherein the first subset is to process the sensor data; and execute the first subset to process the sensor data, wherein a system clock of the first computing device advances during execution of the first subset, and wherein a first timestamp is generated based at least partly on a value of the system clock during execution of the first subset. The system further comprises a second computing device configured to at least: execute a second instance of the vehicle-based processing system; receive simulated sensor data representing data generated by one or more sensors; identify at least a second subset of the plurality of subsystems, wherein the second subset is to process the simulated sensor data; set a simulated clock to a simulated time; and execute the second subset to process the simulated sensor data, wherein the simulated clock remains static during execution of the second subset, and wherein a second timestamp is generated based at least partly on the simulated clock during execution of the second subset.

The system of the preceding paragraph can include any sub-combination of the following features: wherein the first computing device comprises an onboard computing device of a vehicle, and wherein the second computing device comprises a user device separate from the vehicle; wherein the sensor data is generated by at least one of: a LiDAR sensor, a RADAR sensor, an inertial sensor, or a camera; wherein the vehicle-based processing system comprises a computation graph of executable nodelets, wherein individual executable nodelets comprise executable instructions, wherein the computation graph is configured to execute in a simulation mode in which the executable nodelets execute serially to process simulated sensor data, and wherein the computation graph is further configured to execute in a production mode in which two or more nodelets of the executable nodelets execute concurrently to process sensor data received from the one or more sensors; wherein the second computing device is further configured to at least determine, during execution of the second subset, that a callback to a subsystem of the plurality of subsystems is to be executed, and delay execution of the callback to the subsystem until the simulated time represented by the simulated clock is changed, wherein execution of the callback to the subsystem occurs after execution of the second subset has completed; and wherein the first computing device is further configured to at least determine, during execution of the first subset on a first thread, that a callback to a subsystem of the plurality of subsystems is to be executed, and execute the callback to the subsystem on a second thread, wherein execution of the first subset continues on the first thread during execution of the callback to the subsystem on the second thread.

Another aspect of the present disclosure provides a computer-implemented method executed under control of a computing system comprising a computer processor configured to execute specific instructions. The computer-implemented method includes: loading an input data item from an input data collection comprising simulated sensor data; determining a time represented by a first timestamp associated with the input data item; setting a simulated clock to the time represented by the first timestamp; determining that a subsystem of a plurality of subsystems is to process the input data item; and executing the subsystem, wherein a period of time passes during execution of the subsystem, wherein the simulated clock remains static during execution of the subsystem, and wherein the subsystem uses the simulated clock to generate a second timestamp associated with an output message.

The computer-implemented method of the preceding paragraph can include any sub-combination of the following features: executing a second subsystem of the plurality of subsystems to process the output message, wherein the simulated clock remains static during execution of the second subsystem, and wherein the second subsystem uses the simulated clock to generate a third timestamp associated with a second output message; incrementing the simulated clock by a predetermined amount between execution of the subsystem and execution of the second subsystem; determining, during execution of the subsystem, that a callback to a second subsystem of the plurality of subsystems is to be executed, and delaying execution of the callback to the second subsystem until the time represented by the simulated clock is changed, wherein execution of the callback to the second subsystem occurs after execution of the subsystem has completed; advancing the simulated clock to a second time, determining, based at least partly on the second time, that a callback to a second subsystem of the plurality of subsystems is to be executed, and executing the callback to the second subsystem; determining that a second subsystem of the plurality of subsystems is to be executed to process the input data item, and executing the second subsystem after execution of the subsystem completes, wherein the simulated clock remains static during execution of both the subsystem and the second subsystem.

A further aspect of the present disclosure provides a system comprising a computer-readable memory and one or more processors in communication with the computer readable memory. The one or more processors are configured to at least: load an input data item from an input data collection comprising simulated sensor data; determine a time represented by a first timestamp associated with the input data item; set a simulated clock to the time represented by the first timestamp; determine that a subsystem of a plurality of subsystems is to process the input data item; and execute the subsystem, wherein a period of time passes during execution of the subsystem, wherein the simulated clock remains static during execution of the subsystem, and wherein the subsystem uses the simulated clock to generate a second timestamp associated with an output message.

The system of the preceding paragraph can include any sub-combination of the following features: wherein the one or more processors are further configured to at least execute a second subsystem of the plurality of subsystems to process the output message, wherein the simulated clock remains static during execution of the second subsystem, and wherein the second subsystem uses the simulated clock to generate a third timestamp associated with a second output message; wherein the one or more processors are further configured to increment the simulated clock by a predetermined amount between execution of the subsystem and execution of the second subsystem; wherein the simulated clock remains static throughout execution of the subsystem and second subsystem; wherein the one or more processors are further configured to load a second input data item from the input data collection, determine a time represented by a third timestamp associated with the second input data item, set the simulated clock to the time represented by the third timestamp, determine that a third subsystem of the plurality of subsystems is to process the second input data item, and execute the third subsystem, wherein a second period of time passes during execution of the third subsystem, and wherein the simulated clock remains static during execution of the third subsystem; wherein the one or more processors are further configured to at least determine, during execution of the subsystem, that a callback to a second subsystem of the plurality of subsystems is to be executed, and delay execution of the callback to the second subsystem until the time represented by the simulated clock is changed, wherein execution of the callback to the second subsystem occurs after execution of the subsystem has completed; wherein the one or more processors are further configured to at least advance the simulated clock to a second time, determine, based at least partly on the second time, that a callback to a second subsystem of the plurality of subsystems is to be executed, and execute the callback to the second subsystem; and wherein the one or more processors are further configured to at least: determine that a second subsystem of the plurality of subsystems is to be executed to process the input data item, and execute the second subsystem after execution of the subsystem completes, wherein the simulated clock remains static during execution of both the subsystem and the second subsystem.

In other embodiments, a system or systems may operate according to one or more of the methods and/or computer-readable media recited in the preceding paragraphs. In yet other embodiments, a method or methods may operate according to one or more of the systems and/or computer-readable media recited in the preceding paragraphs. In yet more embodiments, a computer-readable medium or media, excluding transitory propagating signals, may cause one or more computing devices having one or more processors and non-transitory computer-readable memory to operate according to one or more of the systems and/or methods recited in the preceding paragraphs.

Terminology

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "comprise," "comprising," and the like are to be construed in an inclusive sense, as opposed to an exclusive or exhaustive sense, i.e., in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words using the singular or plural number may also include the plural or singular number respectively. The word "or" in reference to a list of two or more items, covers all of the following interpretations of the word: any one of the items in the list, all of the items in the list, and any combination of the items in the list. Likewise the term "and/or" in reference to a list of two or more items, covers all of the following interpretations of the word: any one of the items in the list, all of the items in the list, and any combination of the items in the list.

In some embodiments, certain operations, acts, events, or functions of any of the algorithms described herein can be performed in a different sequence, can be added, merged, or left out altogether (e.g., not all are necessary for the practice of the algorithms). In certain embodiments, operations, acts, functions, or events can be performed concurrently, e.g., through multi-threaded processing, interrupt processing, or multiple processors or processor cores or on other parallel architectures, rather than sequentially.

Systems and modules described herein may comprise software, firmware, hardware, or any combination(s) of software, firmware, or hardware suitable for the purposes described. Software and other modules may reside and execute on servers, workstations, personal computers, computerized tablets, PDAs, and other computing devices suitable for the purposes described herein. Software and other modules may be accessible via local computer memory, via a network, via a browser, or via other means suitable for the purposes described herein. Data structures described herein may comprise computer files, variables, programming arrays, programming structures, or any electronic information storage schemes or methods, or any combinations thereof, suitable for the purposes described herein. User interface elements described herein may comprise elements from graphical user interfaces, interactive voice response, command line interfaces, and other suitable interfaces.

Further, processing of the various components of the illustrated systems can be distributed across multiple machines, networks, and other computing resources. Two or more components of a system can be combined into fewer components. Various components of the illustrated systems can be implemented in one or more virtual machines, rather than in dedicated computer hardware systems and/or computing devices. Likewise, the data repositories shown can represent physical and/or logical data storage, including, e.g., storage area networks or other distributed storage systems. Moreover, in some embodiments the connections between the components shown represent possible paths of data flow, rather than actual connections between hardware. While some examples of possible connections are shown, any of the subset of the components shown can communicate with any other subset of components in various implementations.

Embodiments are also described above with reference to flow chart illustrations and/or block diagrams of methods, apparatus (systems) and computer program products. Each block of the flow chart illustrations and/or block diagrams, and combinations of blocks in the flow chart illustrations and/or block diagrams, may be implemented by computer program instructions. Such instructions may be provided to a processor of a general purpose computer, special purpose computer, specially-equipped computer (e.g., comprising a high-performance database server, a graphics subsystem, etc.) or other programmable data processing apparatus to produce a machine, such that the instructions, which execute via the processor(s) of the computer or other programmable data processing apparatus, create means for implementing the acts specified in the flow chart and/or block diagram block or blocks. These computer program instructions may also be stored in a non-transitory computer-readable memory that can direct a computer or other programmable data processing apparatus to operate in a particular manner, such that the instructions stored in the computer-readable memory produce an article of manufacture including instruction means which implement the acts specified in the flow chart and/or block diagram block or blocks. The computer program instructions may also be loaded to a computing device or other programmable data processing apparatus to cause operations to be performed on the computing device or other programmable apparatus to produce a computer implemented process such that the instructions which execute on the computing device or other programmable apparatus provide steps for implementing the acts specified in the flow chart and/or block diagram block or blocks.

Any patents and applications and other references noted above, including any that may be listed in accompanying filing papers, are incorporated herein by reference. Aspects of one or more embodiments can be modified, if necessary, to employ the systems, functions, and concepts of the various references described above. These and other changes can be made in light of the above Detailed Description. While the above description describes certain examples, and describes the best mode contemplated, no matter how detailed the above appears in text, different embodiments can be practiced in many ways. Details of the system may vary considerably in its specific implementation. As noted above, particular terminology used when describing certain features should not be taken to imply that the terminology is being redefined herein to be restricted to any specific characteristics, features with which that terminology is associated. In general, the terms used in the following claims should not be construed to limit the scope the specific examples disclosed in the specification, unless the above Detailed Description section explicitly defines such terms. Accordingly, the actual scope encompasses not only the disclosed examples, but also all equivalent ways of practicing or implementing the claims.

To reduce the number of claims, certain aspects of the present disclosure are presented below in certain claim forms, but the applicant contemplates other aspects of the present disclosure in any number of claim forms. For example, while only one aspect of the present disclosure is recited as a means-plus-function claim under 35 U.S.C sec. 112(f) (AIA), other aspects may likewise be embodied as a means-plus-function claim, or in other forms, such as being embodied in a computer-readable medium. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application, in either this application or in a continuing application.

What is claimed is:

1. A system comprising:
    a first computing device configured to at least:
        execute a first instance of a vehicle-based processing system in a production mode, wherein the vehicle-based processing system comprises a computation graph comprising a plurality of subsystems, wherein individual subsystems of the plurality of subsystems comprise executable instructions, wherein the computation graph is configured to execute in a simulation mode in which the subsystems execute serially to process simulated sensor data, and wherein the computation graph is further configured to execute in the production mode in which two or more subsystems of the plurality of subsystems execute concurrently to process sensor data received from the one or more sensors;
        receive sensor data from one or more sensors coupled to the first computing device;
        identify at least a first subset of the plurality of subsystems, wherein the first subset is to process the sensor data; and
        execute the first subset to process the sensor data, wherein a system clock of the first computing device advances during execution of the first subset, and wherein a first timestamp is generated based at least partly on a value of the system clock during execution of the first subset; and
    a second computing device configured to at least:
        execute a second instance of the vehicle-based processing system in the simulation mode;
        receive simulated sensor data representing data generated by one or more sensors;
        identify at least a second subset of the plurality of subsystems, wherein the second subset is to process the simulated sensor data;
        set a simulated clock to a simulated time; and
        execute the second subset to process the simulated sensor data, wherein the simulated clock remains static during execution of the second subset, and wherein a second timestamp is generated based at least partly on the simulated clock during execution of the second subset.

2. The system of claim 1, wherein the first computing device comprises an onboard computing device of a vehicle, and wherein the second computing device comprises a user device separate from the vehicle.

3. The system of claim 1, wherein the sensor data is generated by at least one of: a LiDAR sensor, a RADAR sensor, an inertial sensor, or a camera.

4. The system of claim 1, wherein the second computing device is further configured to at least:
    determine, during execution of the second subset, that a callback to a subsystem of the plurality of subsystems is to be executed; and
    delay execution of the callback to the subsystem until the simulated time represented by the simulated clock is changed, wherein execution of the callback to the subsystem occurs after execution of the second subset has completed.

5. The system of claim 1, wherein the first computing device is further configured to at least:
    determine, during execution of the first subset on a first thread, that a callback to a subsystem of the plurality of subsystems is to be executed; and
    execute the callback to the subsystem on a second thread, wherein execution of the first subset continues on the first thread during execution of the callback to the subsystem on the second thread.

6. A computer-implemented method comprising:
    under control of a computing system comprising a computer processor configured to execute specific instructions,
        executing an instance of a vehicle-based processing system in a simulation mode, wherein the vehicle-based processing system comprises a computation graph comprising a plurality of subsystems, wherein individual subsystems of the plurality of subsystems comprise executable instructions, wherein the computation graph is configured to execute in the simulation mode in which the subsystems execute serially to process simulated sensor data, and wherein the computation graph is further configured to execute in a production mode in which two or more subsystems of the plurality of subsystems execute concurrently to process sensor data received from the one or more sensors;
        loading an input data item from an input data collection comprising simulated sensor data;
        determining a time represented by a first timestamp associated with the input data item;
        setting a simulated clock to the time represented by the first timestamp;
        determining that a subsystem of the plurality of subsystems is to process the input data item; and
        executing the subsystem, wherein a period of time passes during execution of the subsystem, wherein the simulated clock remains static during execution of the subsystem, and wherein the subsystem uses the simulated clock to generate a second timestamp associated with an output message.

7. The computer-implemented method of claim 6, further comprising executing a second subsystem of the plurality of subsystems to process the output message, wherein the simulated clock remains static during execution of the second subsystem, and wherein the second subsystem uses the simulated clock to generate a third timestamp associated with a second output message.

8. The computer-implemented method of claim 7, further comprising incrementing the simulated clock by a predetermined amount between execution of the subsystem and execution of the second subsystem.

9. The computer-implemented method of claim 6, further comprising:
    determining, during execution of the subsystem, that a callback to a second subsystem of the plurality of subsystems is to be executed; and
    delaying execution of the callback to the second subsystem until the time represented by the simulated clock is changed, wherein execution of the callback to the second subsystem occurs after execution of the subsystem has completed.

10. The computer-implemented method of claim 6, further comprising:
advancing the simulated clock to a second time;
determining, based at least partly on the second time, that a callback to a second subsystem of the plurality of subsystems is to be executed; and
executing the callback to the second subsystem.

11. The computer-implemented method of claim 6, further comprising:
determining that a second subsystem of the plurality of subsystems is to be executed to process the input data item; and
executing the second subsystem after execution of the subsystem completes, wherein the simulated clock remains static during execution of both the subsystem and the second subsystem.

12. A system comprising:
a computer-readable memory; and
one or more processors in communication with the computer readable memory and configured to at least:
execute an instance of a vehicle-based processing system in a simulation mode, wherein the vehicle-based processing system comprises a computation graph comprising a plurality of subsystems, wherein individual subsystems of the plurality of subsystems comprise executable instructions, wherein the computation graph is configured to execute in the simulation mode in which the subsystems execute serially to process simulated sensor data, and wherein the computation graph is further configured to execute in a production mode in which two or more subsystems of the plurality of subsystems execute concurrently to process sensor data received from the one or more sensors;
load an input data item from an input data collection comprising simulated sensor data;
determine a time represented by a first timestamp associated with the input data item;
set a simulated clock to the time represented by the first timestamp;
determine that a subsystem of the plurality of subsystems is to process the input data item; and
execute the subsystem, wherein a period of time passes during execution of the subsystem, wherein the simulated clock remains static during execution of the subsystem, and wherein the subsystem uses the simulated clock to generate a second timestamp associated with an output message.

13. The system of claim 12, wherein the one or more processors are further configured to at least execute a second subsystem of the plurality of subsystems to process the output message, wherein the simulated clock remains static during execution of the second subsystem, and wherein the second subsystem uses the simulated clock to generate a third timestamp associated with a second output message.

14. The system of claim 13, wherein the one or more processors are further configured to increment the simulated clock by a predetermined amount between execution of the subsystem and execution of the second subsystem.

15. The system of claim 13, wherein the simulated clock remains static throughout execution of the subsystem and second subsystem.

16. The system of claim 12, wherein the one or more processors are further configured to:
load a second input data item from the input data collection;
determine a time represented by a third timestamp associated with the second input data item;
set the simulated clock to the time represented by the third timestamp;
determine that a third subsystem of the plurality of subsystems is to process the second input data item; and
execute the third subsystem, wherein a second period of time passes during execution of the third subsystem, and wherein the simulated clock remains static during execution of the third subsystem.

17. The system of claim 12, wherein the one or more processors are further configured to at least:
determine, during execution of the subsystem, that a callback to a second subsystem of the plurality of subsystems is to be executed; and
delay execution of the callback to the second subsystem until the time represented by the simulated clock is changed, wherein execution of the callback to the second subsystem occurs after execution of the subsystem has completed.

18. The system of claim 12, wherein the one or more processors are further configured to at least:
advance the simulated clock to a second time;
determine, based at least partly on the second time, that a callback to a second subsystem of the plurality of subsystems is to be executed; and
execute the callback to the second subsystem.

19. The system of claim 12, wherein the one or more processors are further configured to at least:
determine that a second subsystem of the plurality of subsystems is to be executed to process the input data item; and
execute the second subsystem after execution of the subsystem completes, wherein the simulated clock remains static during execution of both the subsystem and the second subsystem.

* * * * *